United States Patent
Kishi et al.

(10) Patent No.: US 10,476,435 B2
(45) Date of Patent: Nov. 12, 2019

(54) CRYSTAL OSCILLATOR, CRYSTAL RESONATOR CONTROLLING METHOD, AND CRYSTAL RESONATOR CONTROLLING DEVICE

(71) Applicant: FUJITSU LIMITED, Kawasaki-shi, Kanagawa (JP)

(72) Inventors: Masakazu Kishi, Kawasaki (JP); Hajime Kubota, Kawasaki (JP); Masayuki Itoh, Kawasaki (JP); Yoshinori Mesaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 160 days.

(21) Appl. No.: 15/498,679

(22) Filed: Apr. 27, 2017

(65) Prior Publication Data

US 2017/0359025 A1    Dec. 14, 2017

(30) Foreign Application Priority Data

Jun. 10, 2016    (JP) .................................. 2016-116459

(51) Int. Cl.
  *H03B 5/32*    (2006.01)
  *H03L 5/00*    (2006.01)

(52) U.S. Cl.
  CPC .................. *H03B 5/32* (2013.01); *H03L 5/00* (2013.01); *H03B 2200/0018* (2013.01); *H03B 2200/0034* (2013.01); *H03B 2200/0046* (2013.01)

(58) Field of Classification Search
  CPC . H03B 5/32; H03B 5/36; H03B 5/364; H03B 5/06; H03B 2200/0034; H03B 2200/0046; H03L 3/00; H03L 5/00
  See application file for complete search history.

(56) References Cited

U.S. PATENT DOCUMENTS

| | | | |
|---|---|---|---|
| 4,144,747 A | 3/1979 | Datwyler, Jr. | |
| 4,678,905 A | 7/1987 | Phillips | |
| 5,572,322 A | 11/1996 | Noda | |
| 5,654,678 A | 8/1997 | Miyazaki | |
| 7,859,355 B2 * | 12/2010 | Brennan | H03B 5/06 331/177 V |
| 7,893,784 B2 | 2/2011 | Hirama | |

(Continued)

FOREIGN PATENT DOCUMENTS

| | | |
|---|---|---|
| JP | 1-186003 | 7/1989 |
| JP | 3-220806 | 9/1991 |

(Continued)

OTHER PUBLICATIONS

U.S. Notice of Allowance dated Dec. 10, 2018 from U.S. Appl. No. 15/581,908, 12 pages.

(Continued)

*Primary Examiner* — Ryan Johnson
(74) *Attorney, Agent, or Firm* — Staas & Halsey LLP

(57) ABSTRACT

A crystal oscillator includes a crystal resonator; an inverting amplifier configured to be coupled between a pair of excitation electrodes of the crystal resonator; and a control circuit configured to initiate an alarm and raise gain of the inverting amplifier in a case where an index value for representing oscillation amplitude of the crystal resonator in an oscillation state is equal to or lower than a reference value.

16 Claims, 35 Drawing Sheets

(56) References Cited

U.S. PATENT DOCUMENTS

| | | | | |
|---|---|---|---|---|
| 8,456,243 | B2* | 6/2013 | Aleman | H03B 5/36 331/16 |
| 8,564,378 | B2* | 10/2013 | Takahashi | H03B 5/36 331/109 |
| 8,928,419 | B2 | 1/2015 | Ishii | |
| 9,024,695 | B2 | 5/2015 | Kishi | |
| 9,520,830 | B2* | 12/2016 | Sato | H03B 5/36 |
| 2007/0040470 | A1 | 2/2007 | Watanabe | |
| 2008/0279250 | A1 | 11/2008 | Kamei | |
| 2011/0156823 | A1 | 6/2011 | Koyama et al. | |
| 2012/0068776 | A1 | 3/2012 | Asamura et al. | |
| 2012/0326794 | A1* | 12/2012 | Kammula | H03B 5/362 331/15 |
| 2016/0218671 | A1* | 7/2016 | Jun | H03B 5/362 |
| 2017/0359021 | A1 | 12/2017 | Kishi et al. | |
| 2017/0359022 | A1 | 12/2017 | Kishi et al. | |
| 2017/0359023 | A1 | 12/2017 | Kishi et al. | |
| 2017/0359025 | A1 | 12/2017 | Kishi et al. | |
| 2017/0359044 | A1 | 12/2017 | Kishi et al. | |
| 2018/0054163 | A1* | 2/2018 | Chen | H03B 5/32 |

FOREIGN PATENT DOCUMENTS

| | | |
|---|---|---|
| JP | 6-177645 | 6/1994 |
| JP | 8-15122 | 1/1996 |
| JP | 8-327398 | 12/1996 |
| JP | 2004-198126 | 7/2004 |
| JP | 2008-139256 | 6/2008 |
| JP | 2010-232974 | 10/2010 |
| JP | 2011-135342 | 7/2011 |
| JP | 2012-70193 | 4/2012 |
| JP | 2013-106052 | 5/2013 |

OTHER PUBLICATIONS

U.S. Office Action dated Dec. 20, 2018 for copending U.S. Appl. No. 15/602,173, 15 pages.

Rowe, Martin, "Check the clock oscillators," May 1, 2007, retrieved from http://www.edn.com/PDF/View?contentItemId=4381286 on Dec. 14, 2018, 2 pages.

U.S. Appl. No. 15/581,908, filed Apr. 28, 2017, Masakazu Kishi et al., Fujitsu Limited.

U.S. Appl. No. 15/585,249, filed May 3, 2017, Masakazu Kishi et al., Fujitsu Limited.

U.S. Appl. No. 15/602,158, filed May 23, 2017, Masakazu Kishi et al., Fujitsu Limited.

U.S. Appl. No. 15/602,173, filed May 23, 2017, Masakazu Kishi et al., Fujitsu Limited.

U.S. Appl. No. 15/602,202, filed May 23, 2017, Masakazu Kishi et al., Fujitsu Limited.

U.S. Office Action dated Jan. 7, 2019 from U.S. Appl. No. 15/602,202.

* cited by examiner

CRYSTAL OSCILLATOR, CRYSTAL RESONATOR CONTROLLING METHOD, AND CRYSTAL RESONATOR CONTROLLING DEVICE

CROSS-REFERENCE TO RELATED APPLICATION

This application is based upon and claims the benefit of priority of the prior Japanese Patent Application No. 2016-116459, filed on Jun. 10, 2016, the entire contents of which are incorporated herein by reference.

FIELD

The embodiment discussed herein is related to a crystal oscillator, a crystal resonator controlling method, and crystal resonator controlling device.

BACKGROUND

A technique that monitors whether airtightness of a crystal resonator is maintained by monitoring changes in a current which flows in a piezoelectric resonator is known.

Examples of the related art include Japanese Laid-open Patent Publication No. 2010-232974 and Japanese Laid-open Patent Publication No. 06-177645.

However, in the above related art, it is difficult to initiate an alarm and delay output stop timing before the crystal resonator comes to an output stop (for example, a clock stop). Such an output stop of the crystal resonator may occur all of a sudden due to an abnormality or the like.

SUMMARY

According to an aspect of the invention, a crystal oscillator includes a crystal resonator; an inverting amplifier configured to be coupled between a pair of excitation electrodes of the crystal resonator; and a control circuit configured to initiate an alarm and raise gain of the inverting amplifier in a case where an index value for representing oscillation amplitude of the crystal resonator in an oscillation state is equal to or lower than a reference value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, each example will be described in detail with reference to accompanying drawings.

[Embodiment 1]

Figure 1A:
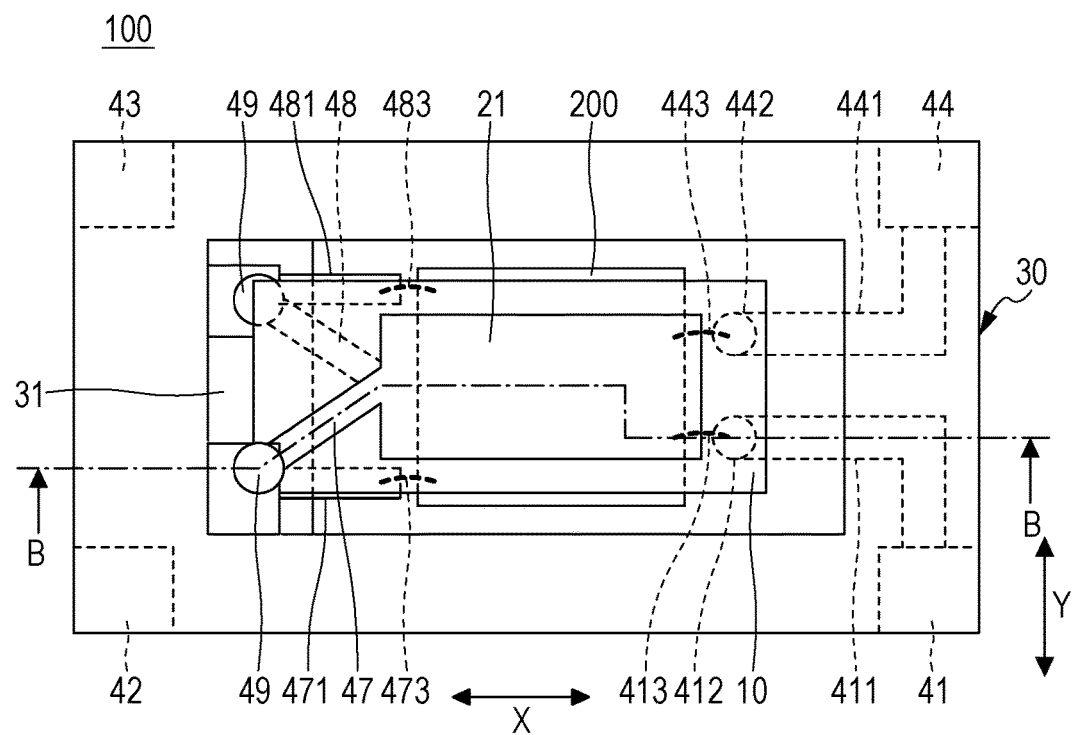
FIG. 1A is a top view roughly illustrating a crystal resonator according to an Embodiment 1.
Figure 1B:
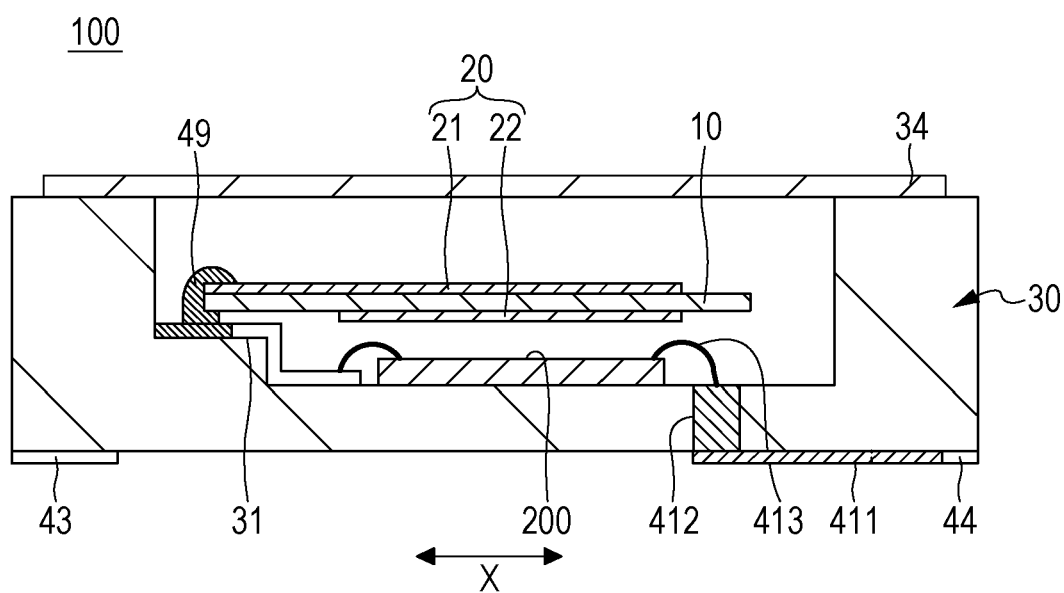
FIG. 1B is a sectional view taken along line B-B in FIG. 1A.

FIG. 1A is a top view roughly illustrating a crystal resonator 100 according to an Embodiment 1 and FIG. 1B is a rough sectional view taken along line B-B in FIG. 1A. In FIG. 1A, a lid of a housing 30 is not illustrated to make sure that an inner portion of the housing 30 can be seen and elements (external electrode 41 and the like) that are unable to be seen are illustrated in dashed lines. Hereinafter, a thickness direction (up-and-down direction of FIG. 1B) of a crystal piece 10 will be referred to as the up-and-down direction and a direction in which the lid of the housing 30 exists will be referred to as an "upper side". However, any orientation may be the orientation of the crystal resonator 100, which is in a mounted state. In addition, hereinafter, an "external surface" refers to an outer surface of the housing 30, which is exposed to the outside, and an "internal surface" refers to an outer surface of the housing 30, which is exposed to an inner space of the housing 30. In addition, as illustrated in FIG. 1A, an X-direction is defined as a direction corresponding to a main oscillation direction of the crystal resonator 100. In FIG. 1A and FIG. 1B, an IC 200 is illustrated as well, in addition to the crystal resonator 100.

The crystal resonator 100 includes the crystal piece 10, an excitation electrode 20, the housing 30, and external electrodes 41 to 44. The crystal resonator 100 is an outer surface mount type as illustrated in FIG. 1A and FIG. 1B.

The crystal piece 10 may be, for example, an AT-cut artificial crystal substrate. The crystal piece 10 may be in any shape. Although the crystal piece 10 is rectangular in the Embodiment 1, the crystal piece 10 may be in other shape. Although the crystal piece 10 may be supported in any structure, the crystal piece 10 may be supported, for example, with a cantilever structure in the housing 30. In examples illustrated in FIG. 1A and FIG. 1B, the crystal piece 10 is supported with the cantilever structure on a bank section 31 of the housing 30. At a time when the crystal resonator 100 is driven, the crystal piece 10 oscillates (thickness shear oscillation) in the X-direction.

The excitation electrode 20 excites the crystal piece 10. The excitation electrode 20 includes an upper excitation electrode 21 provided on an upper outer surface of the crystal piece 10 and a lower excitation electrode 22 provided on a lower outer surface of the crystal piece 10. The excitation electrode 20 excites the crystal piece 10 with aid of potential difference between the upper excitation electrode 21 and the lower excitation electrode 22. The excitation electrode 20 may be formed of gold, silver, aluminum, and the like.

The excitation electrode 20 is electrically connected to the integrated circuit (IC) 200 (an example of a crystal resonator controlling device). The excitation electrode 20 and the IC 200 may be electrically connected to each other by using any method. In the examples illustrated in FIG. 1A and FIG. 1B, the upper excitation electrode 21 is electrically connected to the IC 200 via a conductor pattern 47 and a conductive adhesive 49 that are formed on the upper outer surface of the crystal piece 10 and a conductor pattern 471 and a wire 473 that are formed on the internal surface of a lower portion of the housing 30. In addition, the lower excitation electrode 22 is electrically connected to the IC 200 via a conductor pattern 48 and the conductive adhesive 49 that are formed on the lower outer surface of the crystal piece 10 and the conductor pattern 481 and a wire 483 that are formed on the internal surface of the lower portion of the housing 30. The wires 473 and 483 (and a wire which will be described later) may be formed by wire bonding. The conductive adhesive 49 may be provided on an edge portion (edge portion on a side that is cantilevered) of the crystal piece 10.

The housing 30 accommodates the crystal piece 10. The housing 30 is formed of, for example, a ceramic material. In this case, the housing 30 may be a ceramic package formed, for example, by stacking layers of the ceramic material. The housing 30 includes a lid 34 (refer to FIG. 1B and the like) and the crystal piece 10 is air-tightly enclosed in the inner space (cavity). For example, the inner space of the housing 30 is a vacuum or is filled with dry nitrogen and is sealed with the lid 34. The lid 34 may be a metal plate or a ceramic plate.

The external electrodes 41 to 44 are provided in the housing 30. In the examples illustrated in FIG. 1A and FIG. 1B, the external electrodes 41 to 44 are provided on an external surface of the lower portion of the housing 30. The external electrodes 41 to 44 may be electrically connected to the IC 200. The external electrodes 41 to 44 and the IC 200 may be electrically connected to each other by using any method. In the examples illustrated in FIG. 1A and FIG. 1B, the external electrode 41 is electrically connected to the IC 200 via a conductor pattern 411 formed on the external surface of the lower portion of the housing 30, and a via 412 and a wire 413 that are formed in the housing 30. In addition, the external electrode 44 is electrically connected to the IC 200, in a similar manner, via a conductor pattern 441 formed on the external surface of the lower portion of the housing 30 and a via 442 and a wire 443 that are formed in the housing 30. Although not illustrated, the external electrodes 42 and 43 and the IC 200 may be electrically connected to each other via a conductor pattern or the like in a similar manner.

The external electrodes 41 to 44 may be electrically connected to an external device or the like of the housing 30. That is, by the external electrodes 41 to 44 being electrically connected to the IC 200 and the external device, the IC 200 is electrically connected to the external device or the like. In the examples illustrated in FIG. 1A and FIG. 1B, the external electrodes 41 and 44 may be used to pick up each signal from an alarm output terminal 222 and a clock output terminal 220 (refer to FIG. 2) of the IC 200. In addition, in the examples illustrated in FIG. 1A and FIG. 1B, the external electrodes 42 and 43 may be used to electrically connect the IC 200 to a ground and a power supply (both are not illustrated) (wiring is not illustrated).

As described above, the IC 200 is electrically connected to the excitation electrode 20 of the crystal resonator 100. The IC 200 is an example of a crystal oscillator, along with the crystal resonator 100. In the examples illustrated in FIG.

1A and FIG. 1B, the IC 200 is provided on the internal surface of the lower portion of the housing 30. That is, the IC 200 is provided within the inner space of the housing 30. However, the IC 200 may be provided outside the housing 30 in a modification example. In this case, for example, each of the upper excitation electrode 21 and the lower excitation electrode 22 may be electrically connected to any two of the external electrodes 41 to 44 and the IC 200 may be electrically connected to the two external electrodes.

In the examples illustrated in FIG. 1A and FIG. 1B, the IC 200 may be provided with a bump (terminal) on a lower surface of the IC 200. In this case, the IC 200 may be electrically connected to the via 412 or the like via the bump, instead of the wire 413 or the like.

Figure 2:
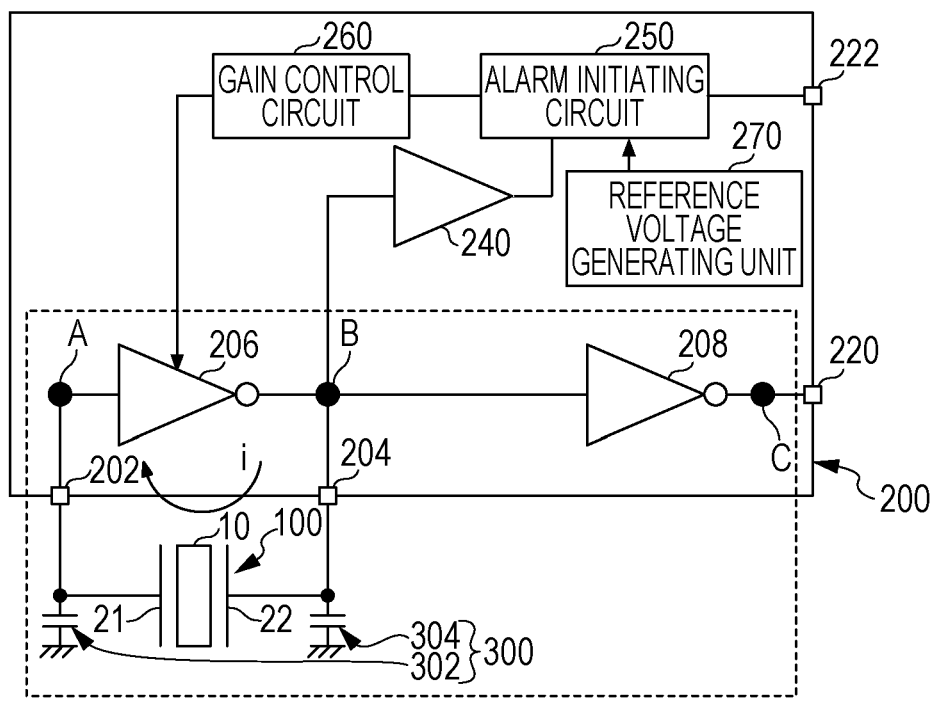
FIG. 2 is a diagram roughly illustrating an example of a circuit configuration of a crystal oscillator including the crystal resonator and an IC (Embodiment 1)

FIG. 2 is a diagram roughly illustrating an example of a circuit configuration of the crystal oscillator including the crystal resonator 100 and the IC 200. In FIG. 2, with respect to the IC 200, internal capacitance of a terminal, stray capacitance of a wiring pattern of a mount substrate, a resistance or the like that limits a current (refer to an arrow i of FIG. 2) that flows in the crystal resonator 100 are not illustrated.

In an example illustrated FIG. 2, the upper excitation electrode 21 and the lower excitation electrode 22 of the crystal resonator 100 are respectively connected to an input terminal 202 and an output terminal 204 of the IC 200. However, the lower excitation electrode 22 and the upper excitation electrode 21 of the crystal resonator 100 may be respectively connected to the input terminal 202 and the output terminal 204 of the IC 200. In cooperation with the IC 200, the crystal resonator 100 generates a clock (reference clock) that may be used in any device (for example, a communication control apparatus such as a base station apparatus and a relay station apparatus).

A matching capacitor 300 is electrically connected to the crystal resonator 100. Specifically, a first capacitor 302 is electrically connected between the upper excitation electrode 21 of the crystal resonator 100 and a ground and a second capacitor 304 is electrically connected between the lower excitation electrode 22 of the crystal resonator 100 and a ground. The matching capacitor 300 is provided to adjust (matching adjustment) an output frequency (initial value) of the crystal resonator 100 such that the output frequency becomes a desired value (design value) when total capacitance (load capacitance value), including a circuit from the crystal resonator 100 to the IC 200, is set as a load. In FIG. 2, an area surrounded by a dotted line forms an oscillation circuit.

The IC 200 includes an inverting amplifier 206, an output buffer (buffer circuit) 208, an amplifier for monitoring 240 (an example of an amplifier), an alarm initiating circuit 250 (an example of a control circuit), a gain control circuit 260 (an example of the control circuit), and a reference voltage generating unit 270.

As described above, the inverting amplifier 206 inverts and amplifies output (signal input from the upper excitation electrode 21 into the input terminal 202) of the crystal resonator 100. That is, the signal input from the upper excitation electrode 21 into the input terminal 202 is inverted and amplified by the inverting amplifier 206. The inverted and amplified signal is input into an output buffer 208 and is input into the lower excitation electrode 22 via the output terminal 204. In addition, the inverted and amplified signal is input into the amplifier for monitoring 240.

Gain of the inverting amplifier 206 is variable. A type of an inverting amplifier (for example, a variable resistance or a type that uses an electric field effect transistor as a variable resistance element) used in automatic gain control (AGC) may be adopted as the inverting amplifier 206. However, in the Embodiment 1, as will be described below, control (that is, automatic gain control) to adjust the gain of the inverting amplifier 206 such that output remains unchanging at all times is not executed. That is, an automatic gain control circuit is not provided. Accordingly, since a circuit configuration for the automatic gain control is unnecessary, a simple configuration can be realized and energy can be saved.

Figure 3:
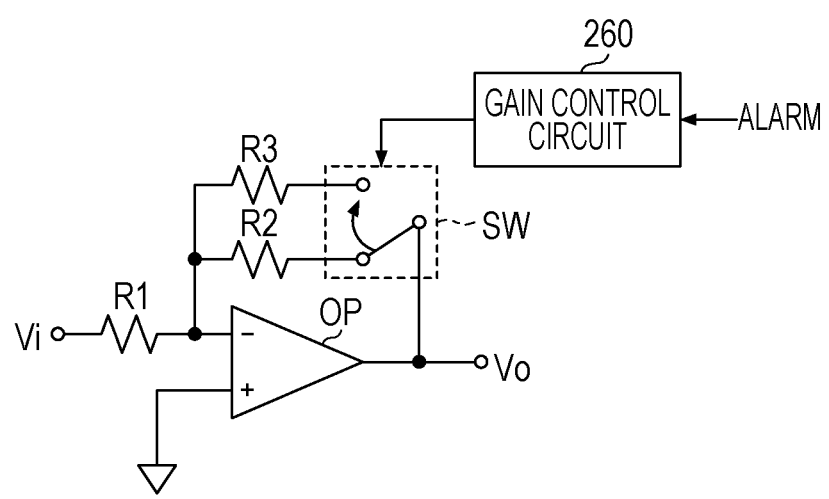
FIG. 3 is a diagram illustrating an example of an inverting amplifier.

In the Embodiment 1, as an example, the inverting amplifier 206 includes an operational amplifier OP, a resistance R2 (an example of a first resistance), and a resistance R3 (an example of a second resistance) as illustrated in FIG. 3. The resistances R2 and R3 are provided in parallel on lines returning output of the operational amplifier OP to an inverting terminal. The inverting amplifier 206 further includes a switch SW. The switch SW can switch between a first state in which the inverting terminal of the operational amplifier OP is electrically connected to an output terminal of the operational amplifier OP via the resistance R2 and a second state in which the inverting terminal of the operational amplifier OP is electrically connected to the output terminal of the operational amplifier OP via the resistance R3. The state of the switch SW is controlled by the gain control circuit 260. In the first state, a relationship between an input voltage Vi and an output voltage Vo is Vo=R2/R1× Vi and R2/R1 is an amplification factor. In the second state, a relationship between the input voltage Vi and the output voltage Vo is Vo=R3/R1×Vi and R3/R1 is an amplification factor. For example, if R3>R2, R3/R1>R2/R1 is established. Therefore, the amplification factor (that is, the gain of the inverting amplifier 206) of the second state is higher than the amplification factor of the first state. According to an example illustrated in FIG. 3, the inverting amplifier 206 of which the gain is variable can be realized with a simple configuration compared to the type of the inverting amplifier in which the variable resistance or the like is used.

The output buffer 208 may be formed of, for example, a complementary metal oxide semiconductor (CMOS). The output buffer 208 generates a signal (pulse signal) representing the oscillation state of the crystal resonator 100 based on an input signal (signal inverted and amplified by the inverting amplifier 206). The output buffer 208 outputs a "voltage VOH" if a level (hereinafter, also referred to as an "input level") of the input signal exceeds a first threshold value and the output buffer 208 outputs a "voltage VOL" if the input level falls short of a second threshold value. The first threshold value and the second threshold value may be set to the same value relying on a voltage value (threshold value level) at which a P-type MOS and an N-type MOS that form the CMOS of the output buffer 208 are turned on and off or may be set to different values. In such a manner, in the example illustrated FIG. 2, the output of the crystal resonator 100 goes through the output buffer 208 and is output to the clock output terminal 220 without being directly output from the crystal resonator 100.

A terminal on an input side of the amplifier for monitoring 240 is electrically connected between (refer to a point B of FIG. 2) the inverting amplifier 206 and the output buffer 208 and a terminal on an output side of the amplifier for monitoring 240 is electrically connected to the alarm initiating circuit 250. By being interposed between the inverting amplifier 206 and the alarm initiating circuit 250, the amplifier for monitoring 240 can input the output from the inverting amplifier 206 into the alarm initiating circuit 250 in a form in which an effect on the oscillation circuit is small. For this purpose, the amplifier for monitoring 240 has high input impedance (that is, high impedance input). In addition, the amplifier for monitoring 240 has low gain and may be used only in a region where linear output with respect to the input (input from the inverting amplifier 206) is obtained. The output of the amplifier for monitoring 240 is input into the alarm initiating circuit 250.

The alarm initiating circuit 250 has a function (hereinafter, referred to as a "state before an output stop detecting function") of detecting a state (hereinafter, referred to as a "state before an output stop") before the crystal resonator 100 comes to an output stop. A phrase "the crystal resonator 100 comes to an output stop" means that the oscillation circuit comes to an output stop. As will be described later, a phrase "the oscillation circuit comes to an output stop" means a transition to a state in which the level of output from the output buffer 208 does not change (state in which normal output that switches between the "VOH" and the "VOL" in a cycle according to the output frequency of the crystal resonator 100 is not obtained).

The alarm initiating circuit 250 is electrically connected between (refer to the point B of FIG. 2) the inverting amplifier 206 and the output buffer 208 via the amplifier for monitoring 240. By monitoring a signal that appears between the inverting amplifier 206 and the output buffer 208, the state before an output stop detecting function is realized. Specifically, the alarm initiating circuit 250 initiates an alarm in a case where amplitude (an example of an index value) of a signal acquired via the amplifier for monitoring 240 is equal to or lower than a reference value $\beta$. The amplitude of the signal may be based on difference between a maximum value and an average value of the level of the signal of the most recent predetermined cycle, a difference between an average value and a minimum value of the level of the signal of the most recent predetermined cycle, or half a difference between a maximum value and a minimum value of the level of the signal of the most recent predetermined cycle. The alarm initiating circuit 250 may use the maximum value (another example of the index value) of the level of the signal of the most recent predetermined cycle instead of the amplitude. That is because, for example, the maximum value of the level of the signal of one most recent predetermined cycle is different from the amplitude of the same signal in the same cycle. Alternatively, from a similar point of view, the alarm initiating circuit 250 may use an integrated value (another example of the index value) of amplitude values of the signal of the most recent predetermined cycle, instead of the amplitude.

The reference value $\beta$ is set to a value greater than an input lower limit value of the output buffer 208. The reference value $\beta$ satisfies $\beta > \alpha \times \gamma$ when the input lower limit value of the output buffer 208 is "$\alpha$" and an amplification factor of the amplifier for monitoring 240 is "$\gamma$". For example, the reference value $\beta$ may satisfy $\beta = 1.1 \times (\alpha \times \gamma)$ or $\beta > 1.1 \times (\alpha \times \gamma)$. The input lower limit value of the output buffer 208 corresponds to a lower limit value of an input level (for example, the magnitude of an input voltage) with respect to the output buffer 208 when the output is obtained from the output buffer 208. That is, even if input into the output buffer 208 oscillates, the CMOS is not turned on and off and meaningful output (output that can function as a clock source) from the output buffer 208 is not obtained in a state where the level of the input into the output buffer 208 falls short of a certain lower limit value. The input lower limit value of the output buffer 208 corresponds to the lower limit value. The reference value $\beta$ may be uniformly set based on a design value of the input lower limit value of the output buffer 208. Alternatively, the reference value $\beta$ may be set individually based on each individual measured value corresponding to the input lower limit value that may be different for each individual output buffer 208. In this case, for example, the reference value $\beta$ may be set based on a measured value at a time of shipment of products, including the crystal resonator 100 and the IC 200.

The alarm initiated by the alarm initiating circuit 250 is output to the outside via the alarm output terminal 222 and is input into the gain control circuit 260. The alarm output via the alarm output terminal 222 may be transmitted, for example, to an external user device (not illustrated). In a case where the output of the crystal resonator 100 functions as a clock of a communication control apparatus, the user device may be, for example, a central management server that manages a base station or the like. In this case, the alarm may be a signal that brings about warning output by some voices or displays or may include information of an index value representing a state of a decline in the current oscillation level. For example, a user, who is a telecommunications carrier, receives such warning output and can schedule repair and replacement work for the communication control apparatus in which the crystal resonator 100 (crystal resonator 100 of which a state before an output stop is detected) that caused the alarm to be initiated is mounted.

The gain control circuit 260 has a function of raising the gain of the inverting amplifier 206 in synchronization with the initiation of the alarm. That is, the gain control circuit 260 raises the gain of the inverting amplifier 206 from a first value to a second value once the alarm from the alarm initiating circuit 250 is input. The second value is meaningfully greater than the first value and is, for example, a maximum value of a variable region. Accordingly, the amplitude of the output from the inverting amplifier 206 increases and thus the amplitude of the input into the output buffer 208 can be heightened. In the example illustrated in FIG. 3, once the alarm from the alarm initiating circuit 250 is input, the gain control circuit 260 controls the switch SW and switches (refer to an arrow of FIG. 3) from the first state to the second state. Accordingly, the gain of the inverting amplifier 206 increases from R2/R1 to R3/R1.

The gain control circuit 260 maintains the gain of the inverting amplifier 206 at the first value until the alarm from the alarm initiating circuit 250 is input. The gain control circuit 260 changes the gain of the inverting amplifier 206 to the second value and then maintains the gain of the inverting amplifier 206 at the second value once the alarm is input. In this case, the first value (R2/R1)<the second value (R3/R1) is satisfied. Therefore, energy can be saved until the alarm from the alarm initiating circuit 250 is input and the gain of the inverting amplifier 206 can be maintained at an increased state after the alarm from the alarm initiating circuit 250 is input.

The reference voltage generating unit 270 generates a voltage corresponding to the reference value $\beta$ used by the alarm initiating circuit 250. For example, the voltage generated by the reference voltage generating unit 270 may be input into a comparator (not illustrated) of the alarm initiating circuit 250.

Next, advantages according to the Embodiment 1 will be described with reference to FIG. 4 to FIG. 7C. Hereinafter, in some cases, the advantages according to the Embodiment 1 are described in comparison to a comparative example, which is a configuration where the gain control circuit 260 is not provided.

Figure 4:
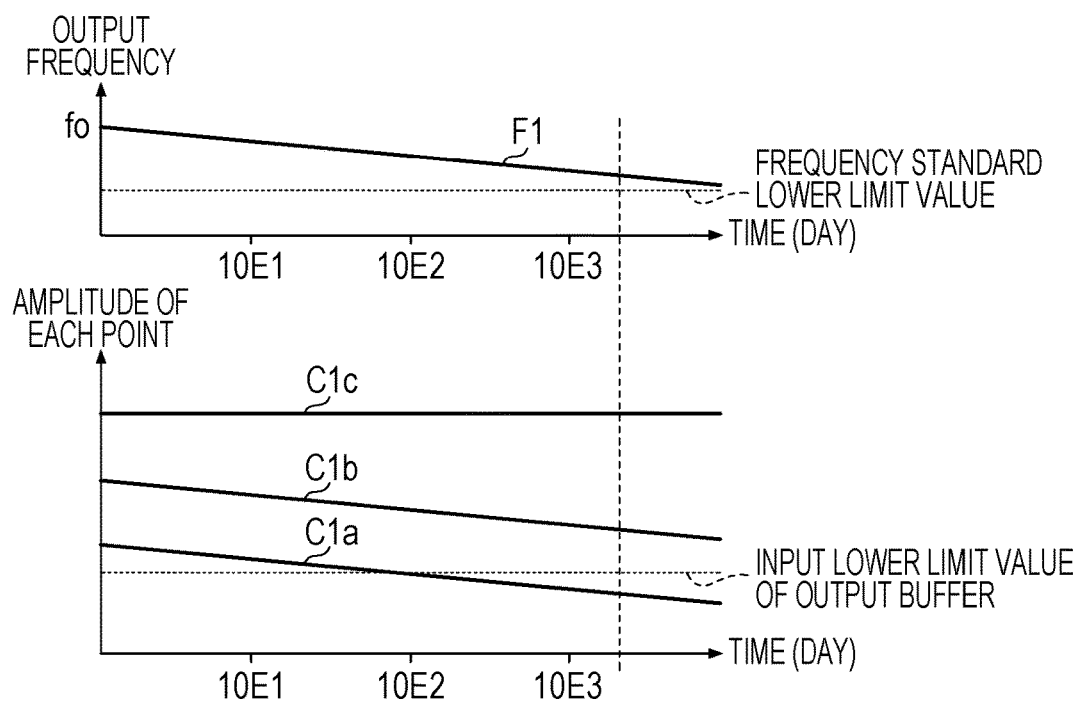
FIG. 4 is an explanatory diagram of a characteristic in a case where the crystal resonator is a normal product.

FIG. 4 is an explanatory diagram of a characteristic in a case where the crystal resonator 100 is a normal product.

In FIG. 4, on the upper side, time is plotted on the horizontal axis, the output frequency of the crystal resonator 100 is plotted on the vertical axis, and a frequency characteristic diagram illustrates a time change characteristic of the output frequency of the crystal resonator 100. In the frequency characteristic diagram, a frequency standard lower limit value with respect to the output frequency of the crystal resonator 100 is illustrated and a time change characteristic F1 related to the normal product is illustrated.

In FIG. 4, on the lower side, time is plotted on the horizontal axis, the amplitude of the signal appears at each of points A, B, and C within the oscillation circuit illustrated in FIG. 2 is plotted on the vertical axis, and an output change characteristic diagram illustrates time change characteristics C1a, C1b, and C1c of the amplitude of each of the points A, B, and C. In the output change characteristic diagram, the input lower limit value of the output buffer 208 is also illustrated.

In a case of the normal product, the output frequency of the crystal resonator 100 declines from an initial value f0 in proportion to an exponential increase in time due to aging (aging degradation), as illustrated in the time change characteristic F1 on the upper side of FIG. 4. However, in a case of the normal product, the output frequency of the crystal resonator 100 does not fall short of the frequency standard lower limit value before a design life (for example, six years). A main cause for the frequency change is the oxidation of the excitation electrode 20 of the crystal resonator 100. The amount of change in frequency caused by the aging can be controlled to a certain degree with the management of manufacturing process or the like. If it is as designed, as illustrated in FIG. 4, the output frequency of the crystal resonator 100 before the design life does not fall below the frequency standard lower limit value.

In addition, in a case of the normal product, as illustrated in the time change characteristic C1b of the lower side of FIG. 4, amplitude of a signal that appears at the point B within the oscillation circuit illustrated in FIG. 2 declines due to the aging. As in the case of the frequency change, a main cause for the amplitude change is an increase in mass due to the oxidation of the excitation electrode 20 of the crystal resonator 100. However, in a case of the normal product, the amplitude of the signal that appears at the point B illustrated in FIG. 2 does not fall short of the input lower limit value of the output buffer 208 before the design life. That is, if it is as designed, the amplitude of the input into the output buffer 208 does not fall below the input lower limit value before the design life. Therefore, in a case of the normal product, amplitude of a signal that appears at the point C illustrated in FIG. 2 does not change and remain unchanging, as illustrated in the time change characteristic C1c on the lower side of FIG. 4. That is, in a case of the normal product, output (that is, normal output) that switches between the "VOH" and the "VOL" in a cycle according to the output frequency of the crystal resonator 100 is obtained at the point C illustrated in FIG. 2 until the design life is reached.

Figure 5:
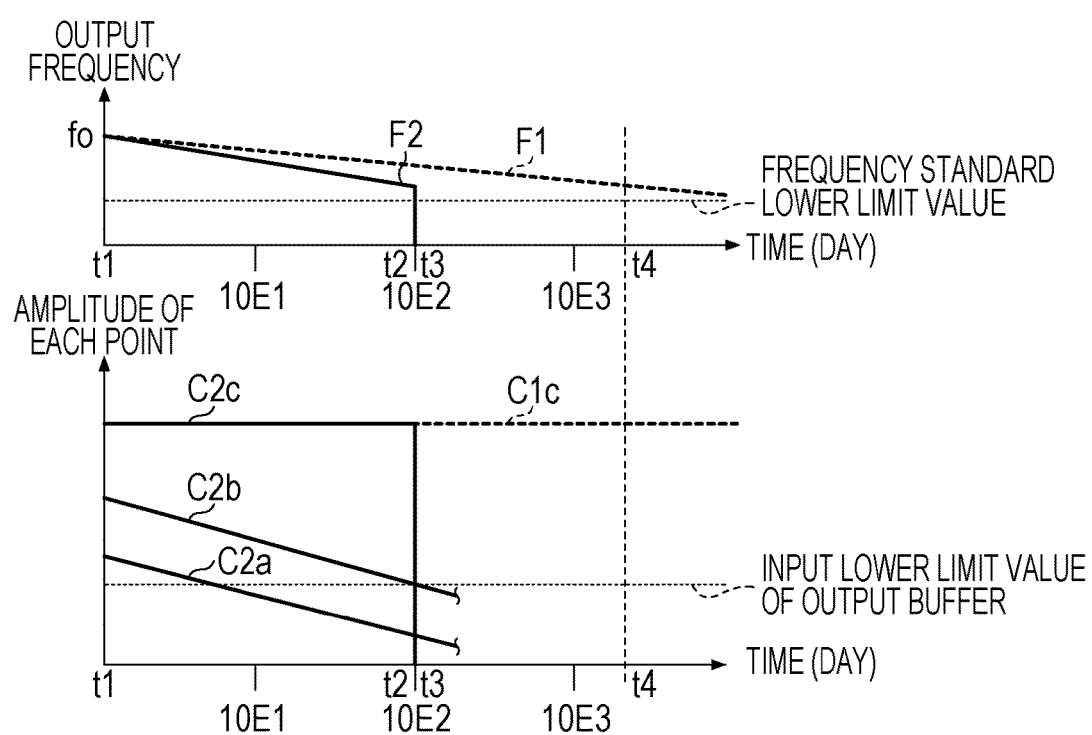
FIG. 5 is an explanatory diagram of an output stop of the crystal resonator caused by an abnormality.
Figure 6A:
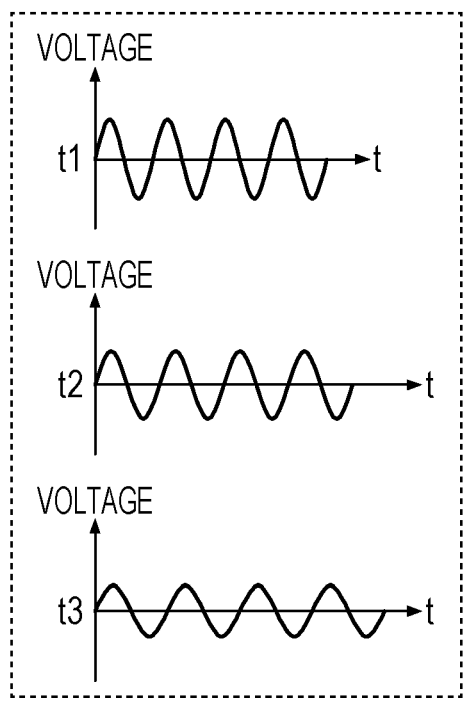
FIG. 6A is a diagram illustrating a time-series waveform of a signal that appears in a case of an abnormal product.
Figure 6B:
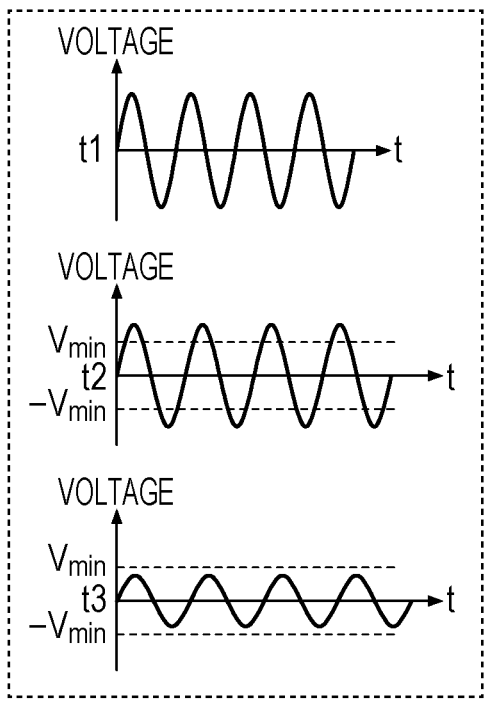
FIG. 6B is a diagram illustrating the time-series waveform of the signal that appears in a case of the abnormal product.
Figure 6C:
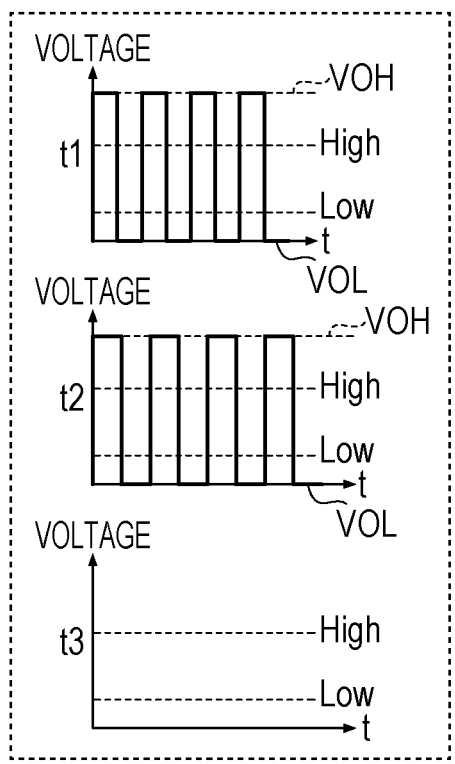
FIG. 6C is a diagram illustrating the time-series waveform of the signal that appears in a case of the abnormal product.

FIG. 5 to FIG. 6C are explanatory diagrams of the output stop of the crystal resonator 100 caused by an abnormality. In FIG. 5, t1 represents an operation start time point of the crystal resonator 100, t2 represents a time point immediately before the crystal resonator 100 comes to an output stop, t3 represents a time point at which the crystal resonator 100 has come to an output stop, and t4 represents a time point of the design life.

In FIG. 5, on the upper side, time is plotted on the horizontal axis, the output frequency of the crystal resonator 100 is plotted on the vertical axis, and a frequency characteristic diagram illustrates a time change characteristic of the output frequency of the crystal resonator 100. In the frequency characteristic diagram, the frequency standard lower limit value with respect to the output frequency of the crystal resonator 100 is illustrated and the time change characteristic F1 (dotted line) related to the normal product and a time change characteristic F2 (solid line) related to an abnormal product that comes to an output stop before the design life are illustrated. The time change characteristic F2 related to the abnormal product indicates, as an example, a case where the crystal resonator 100 comes to an output stop approximately 100 days after the operation start.

In FIG. 5, on the lower side, time is plotted on the horizontal axis, the amplitude of the signal that appears at each of the points A, B, and C illustrated in FIG. 2 is plotted on the vertical axis, and an output change characteristic diagram illustrates time change characteristics (the same characteristics related to the abnormal product) C2a, C2b, and C2c of the amplitude at each of the points A, B, and C. In the output change characteristic diagram, the input lower limit value of the output buffer 208 is illustrated and the time change characteristic C1c (dotted line) related to the normal product is also illustrated.

FIG. 6A to FIG. 6C are diagrams illustrating a time-series waveform of a signal that appears in a case of the abnormal product. FIG. 6A illustrates a waveform of a signal that appears at the point A illustrated in FIG. 2. FIG. 6B illustrates a waveform of the signal that appears at the point B illustrated in FIG. 2. FIG. 6C illustrates a waveform of the signal that appears at the point C illustrated in FIG. 2. In FIG. 6A to FIG. 6C, each waveform within a certain period of time from a time point t1, within a certain period of time before a time point t2, and within a certain period of time from a time point t3 is sequentially illustrated from top. In FIG. 6B, a positive voltage value $V_{min}$ that has the same magnitude as the input lower limit value and a negative voltage value $V_{min}$ that has the same magnitude as the input lower limit value are also illustrated. In addition, in FIG. 6C, a voltage level "High", which is exceeded by output VOH, and a voltage level "Low", which falls short of output VOL, are also illustrated.

Herein, in some case, the declining rates of the output frequency of the crystal resonator 100 and the oscillation level become significant due to some abnormalities in the manufacturing process or the mixing of pollutants. In such a case, an abnormal product that comes to an output stop before the design life may be generated.

Specifically, in a case of the abnormal product, the output frequency of the crystal resonator 100 declines from the initial value f0 at a meaningfully faster rate than the declining rate caused by the aging in the normal product, as illustrated in the time change characteristic F2 on the upper side of FIG. 5. In a case where the output of the crystal resonator 100 is used as a clock of a stand-alone system, even if the frequency declines, it is likely that the frequency decline can be allowed to a degree that a computing speed slightly drops until time t2. However, at time t3, an output stop occurs suddenly and the entire system goes down.

More specifically, in a case of the abnormal product, amplitude of the signal that appears at the point A within the oscillation circuit illustrated in FIG. 2 declines by an amount meaningfully greater than the amount of decline caused by the aging in the normal product, as illustrated in the time change characteristic C2a on the lower side of FIG. 5 and FIG. 6A. Along with this, in a case of the abnormal product, the amplitude of the signal that appears at the point B within the oscillation circuit as illustrated in FIG. 2 declines by an amount meaningfully greater than the amount of decline caused by the aging in the normal product, as illustrated in the time change characteristic C2b on the lower side of FIG. 5 and FIG. 6B. Therefore, in a case of the abnormal product, the amplitude of the signal that appears at the point B illustrated in FIG. 2 falls short of the input lower limit value of the output buffer 208 before the design life.

In this regard, in the comparative example, in a case of the abnormal product illustrated in FIG. 5, the amplitude of the signal that appears at the point B within the oscillation circuit illustrated in FIG. 2 falls short of the input lower limit value of the output buffer 208 at the time t3, as illustrated in the time change characteristic C2b on the lower side of FIG. 5 and FIG. 6B. In this manner, in a case of the abnormal product illustrated in FIG. 5, the amplitude of the signal that appears at the point B within the oscillation circuit illustrated in FIG. 2, that is, the amplitude of the input into the output buffer 208, falls below the input lower limit value before the design life. If the amplitude of the input into the output buffer 208 falls short of the input lower limit value of the output buffer 208, the level of signal that appears at the point C illustrated in FIG. 2 becomes an unchanging value of 0, as illustrated in the time change characteristic C2c on the lower side of FIG. 5 and FIG. 6C. That is, before the design life, the crystal resonator 100 comes to an output stop while maintaining the oscillation state (refer to FIG. 6A).

Meanwhile, in many cases, the abnormality of the crystal resonator 100 results in an abnormal frequency change. Since the oscillation circuit including the crystal resonator 100 is a clock generation source of the crystal resonator 100 itself, a reference clock with higher accuracy has to directly detect a frequency change of the crystal resonator 100. Therefore, it is difficult to detect an abnormality (for example, a characteristic such as the time change characteristic F2 of FIG. 5) of the frequency of the crystal resonator 100 with a simple method.

In this regard, the frequency change (decline) of the crystal resonator 100 caused by the mixing of pollutants correlates with a change in the oscillation level of the crystal resonator 100 as illustrated in FIG. 4 and FIG. 5. That is because, for example, in a case of an increase in mass of the excitation electrode 20 caused by the mixing of pollutants, both the output frequency and the oscillation level of the crystal resonator 100 decline due to the increase in mass. Therefore, even in a case where the frequency change of the crystal resonator 100 may not be directly detected, the frequency change of the crystal resonator 100 can be indirectly detected by monitoring the oscillation level of the crystal resonator 100.

On the other hand, as described above, the output of the crystal resonator 100 is not directly output from the oscillation circuit, which includes the crystal resonator 100, and goes through the output buffer 208. The output buffer 208, as illustrated in FIG. 5 and the like, even in a case of the abnormal product, the output of the output buffer 208 oscillates between the output VOH and the output VOL at a frequency corresponding to the output frequency insofar as the amplitude of the input exceeds the input lower limit value of the output buffer 208. Even in a case of the abnormal product, each level of the output VOH and the output VOL is substantially unchanging insofar as the amplitude of the input exceeds the input lower limit value of the output buffer 208. Therefore, the abnormality of the oscillation circuit (for example, the crystal resonator 100) may not be directly read based on the output from the output buffer 208. For this reason, failure of the oscillation circuit, which includes the crystal resonator 100, is often first found out only when the output falls below the standard (for example, the frequency standard lower limit value) or the crystal resonator 100 comes to an output stop. In many cases, a main cause for the failure of the oscillation circuit, which includes the crystal resonator 100, is often the provided crystal resonator 100.

In this manner, in many cases, the abnormality of the crystal resonator 100 is first found out only when the crystal resonator 100 comes to an output stop. This means that repair and replacement timing of the crystal resonator 100 comes all of a sudden and it is greatly inconvenient for the user of a system in which the output from the oscillation circuit, which includes the crystal resonator 100, is set as a clock source. In particular, in a case where the crystal resonator 100 is used in a system that has to have high reliability, an adverse effect when the system goes down all of a sudden may be great. In addition, in a case where the crystal resonator 100 is used in the relay station apparatus or the like provided in secluded mountains, it takes some time for the repair and replacement work to be completed in some cases and downtime of the system may prolong. Such inconvenience can be avoided to a certain degree by a redundant system being provided but providing the redundant system incurs costs.

In this regard, according to the Embodiment 1, as described above, the alarm initiating circuit 250 initiates an alarm in a case where the amplitude of the signal acquired via the amplifier for monitoring 240 is equal to or lower than the reference value $\beta$. As described above, the reference value $\beta$ satisfies $\beta > \alpha \times \gamma$ when the input lower limit value of the output buffer 208 is represented by "$\alpha$" and the amplification factor of the amplifier for monitoring 240 is represented by "$\gamma$". Therefore, according to the Embodiment 1, the alarm initiating circuit 250 can initiate an alarm before the amplitude of the signal that appears at the point B within the oscillation circuit illustrated in FIG. 2 falls short of the input lower limit value of the output buffer 208. As a result, the alarm can let the user of the system, in which the output from the oscillation circuit, which includes the crystal resonator 100, is set as a clock source, know a desired timing for repair and replacement beforehand. That is, before the crystal resonator 100 comes to an output stop, the alarm can let the user know a desired timing for repair and replacement beforehand. As a result, a situation in which the system goes down all of a sudden can be avoided by the user scheduling appropriate repair and replacement work.

In addition, according to the Embodiment 1, as described above, the gain control circuit 260 raises the gain of the inverting amplifier 206 in synchronization with the initiation of the alarm. Once the gain of the inverting amplifier 206 is raised, the amplitude (amplitude of the input into the output buffer 208) of the output from the inverting amplifier 206 increases. Therefore, according to the Embodiment 1, the amplitude of the input into the output buffer 208 can be increased in synchronization with the initiation of the alarm. As a result, a period until the crystal resonator 100 comes to an output stop can be extended. That is, according to the Embodiment 1, even in a case of the abnormal product, the period until the crystal resonator 100 comes to an output stop can be extended in response to the initiation of the alarm. As a result, the user is likely to get time desired for executing appropriate repair and replacement work. Such an advantage is useful, in particular, in a case where the crystal resonator 100 is used in the relay station apparatus or the like provided in secluded mountains. That is because, in many cases, it takes some time for the repair and replacement work to be completed in such a case.

Figure 7:
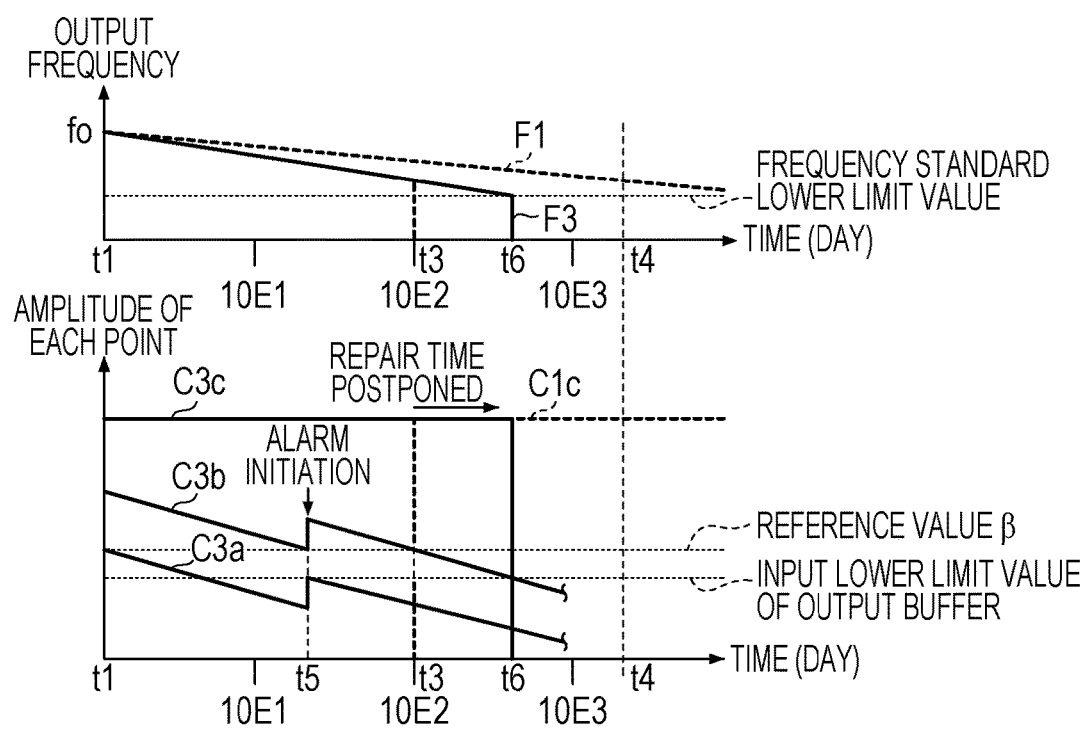
FIG. 7 is an explanatory diagram of an operation example according to the Embodiment 1.

FIG. 7 is an explanatory diagram of an operation example according to the Embodiment 1. In FIG. 7, t1 represents the operation start time point of the crystal resonator 100, t5 represents a detection time point in the state before an output stop, t6 represents a time point at which the crystal resonator 100 in the Embodiment 1 has come to an output stop, and t4 represents a time point of the design life. In addition, in FIG. 7, the output stop time point t3 in a case of FIG. 5 is illustrated for comparison. In FIG. 7, a case where the repair and replacement of the crystal resonator 100 are not performed until the crystal resonator 100 comes to an output stop is illustrated.

In FIG. 7, as in the FIG. 5, on the upper side, time is plotted on the horizontal axis, the output frequency of the crystal resonator 100 is plotted on the vertical axis, and a frequency characteristic diagram illustrates the time change characteristic of the output frequency of the crystal resonator 100. In the frequency characteristic diagram, the frequency standard lower limit value with respect to the output frequency of the crystal resonator 100 is illustrated and the time change characteristic F1 (dotted line) related to the normal product and a time change characteristic F3 (solid line) related to the abnormal product that comes to an output stop before the design life are illustrated. The abnormal product in FIG. 7 is the same abnormal product in the FIG. 5.

As in the FIG. 5, in FIG. 7, on the lower side, time is plotted on the horizontal axis, the amplitude of the signal that appears at each of the points A, B, and C illustrated in FIG. 2 is plotted on the vertical axis, and an output change characteristic diagram illustrates time change characteristics (the same characteristic related to the abnormal product) C3a, C3b, and C3c of the amplitude of each of the points A, B, and C. In the output change characteristic diagram, the input lower limit value of the output buffer 208 and reference value β are illustrated together and the time change characteristic C1c (dotted line) related to the normal product is illustrated together.

In a case of the abnormal product, as in the FIG. 5, the output frequency of the crystal resonator 100 declines from the initial value f0 at a rate meaningfully faster than the declining rate caused by the aging in the normal product as illustrated in the time change characteristic F3 on the upper side of FIG. 7. However, in the Embodiment 1, as described above, by the gain control circuit 260 functioning, the output stop at the time t3 and going down of the entire system can be reduced unlike the FIG. 5. That is, even in a case of the abnormal product, timing at which the entire system goes down can be delayed to time t6, which is later than the time t3, as illustrated in the time change characteristic F3 on the upper side of FIG. 7. In an example illustrated in FIG. 7, although timing at which the output frequency of the crystal resonator 100 falls short of the frequency standard lower limit value is the same as the timing at which the entire system goes down (that is, time t6 at which the level of the signal that appears at the point C becomes an unchanging value of 0), the timing at which the output frequency of the crystal resonator 100 falls short of the frequency standard lower limit value is not limited to the timing at which the entire system goes down. However, the timing at which the output frequency of the crystal resonator 100 falls short of the frequency standard lower limit value preferably does not come before the timing at which the entire system goes down.

In addition, in a case of the abnormal product, the amplitude of the signal that appears at the point A within the oscillation circuit illustrated in FIG. 2 declines by an amount meaningfully greater than the amount of decline caused by the aging in the normal product, as illustrated in the time change characteristic C3a on the lower side of FIG. 7. Along with this, in a case of the abnormal product, the amplitude of the signal that appears at the point B within the oscillation circuit illustrated in FIG. 2 declines by an amount meaningfully greater than the amount of decline caused by the aging in the normal product, as illustrated in the time change characteristic C3b on the lower side of FIG. 7. Therefore, in a case of the abnormal product, the amplitude of the signal that appears at the point B illustrated in FIG. 2 falls short of the input lower limit value of the output buffer 208 before the design life, as in the FIG. 5.

In this regard, according to the Embodiment 1, an alarm is initiated at the time t5, which is timing at which the amplitude of the signal that appears at the point B within the oscillation circuit illustrated in FIG. 2 is equal to or lower than the reference value β, as schematically illustrated by an arrow on the lower side of FIG. 7. Along with this, the gain of the inverting amplifier 206 is raised and the amplitude (amplitude of the input into the output buffer 208) of the signal that appears at the point B within the oscillation circuit illustrated in FIG. 2 increases as illustrated in the time change characteristic C3b on the lower side of FIG. 7. Along with this, the oscillation level of the crystal resonator 100 increases and the amplitude of the signal that appears at the point A within the oscillation circuit illustrated in FIG. 2 increases as illustrated in the time change characteristic C3a on the lower side of FIG. 7. In such a manner, the amplitude of the signal that appears at the point B within the oscillation circuit illustrated in FIG. 2 increases at the time t5. However, after then, the amplitude of the signal that appears at the point B within the oscillation circuit illustrated in FIG. 2 continues to decline by an amount meaningfully greater than the amount of decline caused by the aging in the normal product since the crystal resonator 100 is an abnormal product. Thus, the amplitude of the signal that appears at the point B illustrated in FIG. 2 may fall short of the input lower limit value of the output buffer 208 before the design life. In a case of the abnormal product illustrated in FIG. 7, the amplitude of the signal that appears at the point B within the oscillation circuit illustrated in FIG. 2 falls short of the input lower limit value of the output buffer 208 at the time t6 as illustrated in the time change characteristic C3b on the lower side of FIG. 7. In this manner, in a case of the abnormal product illustrated in FIG. 7, the amplitude of the signal that appears at the point B within the oscillation circuit illustrated in FIG. 2, that is, the amplitude of the input into the output buffer 208, falls below the input lower limit value before the design life and the crystal resonator 100 in the oscillation state comes to an output stop before the design life. However, in the Embodiment 1, as can be seen from the comparison with FIG. 5, the time t6, at which the crystal resonator 100 comes to an output stop, comes later than the same time t3 in FIG. 5. That is, in the Embodiment 1, compared to the comparative example, timing at which the crystal resonator 100 comes to an output stop can be delayed even in a case of the abnormal product. In other words, in the Embodiment 1, compared to the comparative example, the repair and replacement timing of the crystal resonator 100 can be delayed by a period of the time t3 to the time t6. In the example illustrated in FIG. 7, a situation in which the system goes down all of a sudden at the time t6 can be avoided in a case where the repair and replacement work of the crystal resonator 100 is performed during the period of the time t3 to the time t6.

Although the functions of the alarm initiating circuit 250, the gain control circuit 260, and the reference voltage generating unit 270 are realized by the IC 200 in the Embodiment 1 described above, at least a part of the functions may be realized by a computer. For example, the functions of the alarm initiating circuit 250 and the gain control circuit 260 may be realized by a program being executed by a central processing unit (CPU) of the computer and the function of the reference voltage generating unit 270 may be realized by a memory of the computer.

[Embodiment 2]

An Embodiment 2 is different from the Embodiment 1 described above in that the output of the crystal resonator in the oscillation state is electromagnetically monitored. That is, in the Embodiment 1 described above, the output of the crystal resonator in the oscillation state is monitored via the signal that appears at the point B (between the inverting amplifier 206 and the output buffer 208) within the oscillation circuit, as described above. On the contrary, in the Embodiment 2, as will be described below, the output of the crystal resonator in the oscillation state is monitored using a signal that appears in a coil in which the number of magnetic field lines passing though the coil changes according to the oscillation of the crystal resonator.

Figure 8:
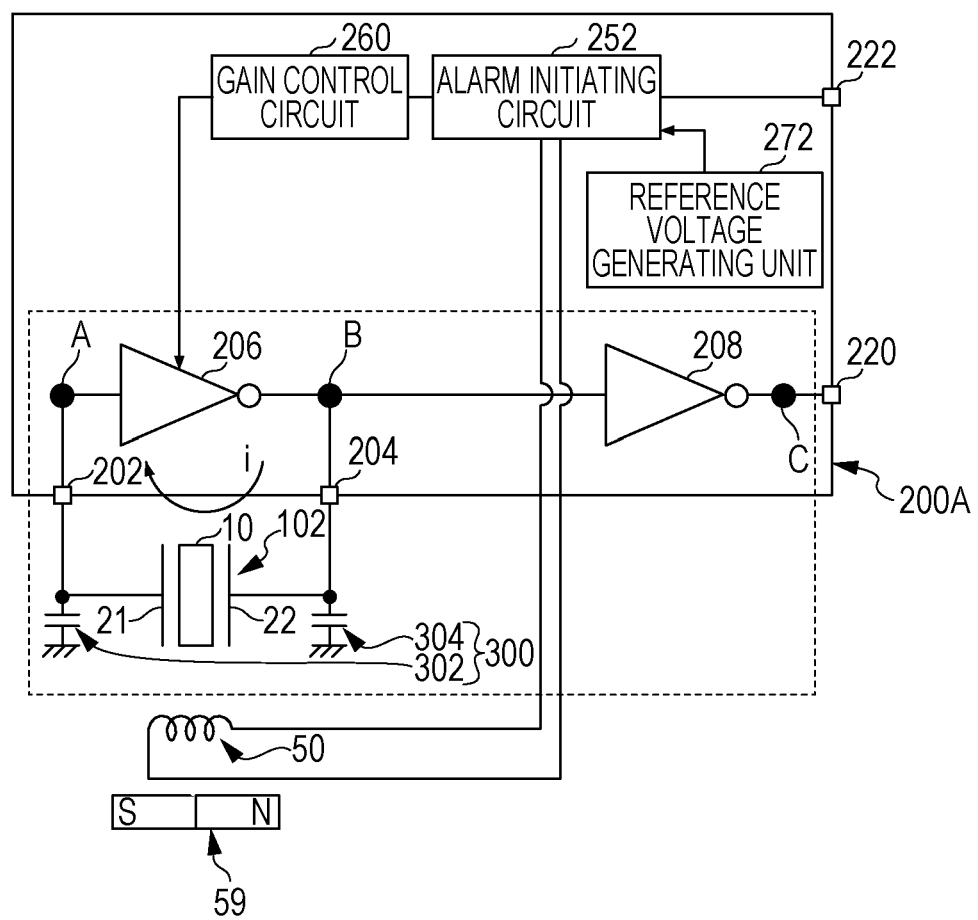
FIG. 8 is a diagram roughly illustrating an example of a circuit configuration of a crystal oscillator including a crystal resonator and an IC (Embodiment 2)

FIG. 8 is a diagram roughly illustrating an example of a circuit configuration of a crystal oscillator including a crystal resonator 102 and an IC 200A. In FIG. 8, with respect to the IC 200A, internal capacitance of a terminal, stray capacitance of a wiring pattern of a mount substrate, a resistance or the like that limits a current (refer to the arrow i of FIG. 8) that flows in the crystal resonator 102 are not illustrated. In FIG. 8, the same reference numerals will be attached to configuration elements that may be seen as the same as the configuration elements in the Embodiment 1 described above will be attached and description of the same configuration elements will not be repeated.

The crystal resonator 102 is different from the crystal resonator 100 according to the Embodiment 1 described above in that a coil 50 and a magnet 59 (an example of a magnetic flux generating member) are added to the crystal resonator 102.

The coil 50 and the magnet 59 are provided in the crystal resonator 102 such that the number of magnetic field lines formed from the magnet 59, which is the number of magnetic field lines passing through the coil 50, changes according to the oscillation of the crystal resonator 102. For example, the coil 50 may be formed in the crystal piece 10 and the magnet 59 may be provided in the housing 30. In this case, the coil 50 may be formed as a coil pattern on the upper outer surface and/or the lower outer surface of the crystal piece 10 (refer to FIG. 10). The magnet 59 may be formed of, for example, a permanent magnet. The magnet 59 may be provided at a position where the number of magnetic field lines passing through the coil 50 is maximum in a neutral state (for example, a state in which the crystal piece 10 does not oscillate) of the crystal piece 10.

The IC 200A is different from the IC 200 according to the Embodiment 1 described above in that the IC 200A does not have the amplifier for monitoring 240 and is provided with each of an alarm initiating circuit 252 and a reference voltage generating unit 272 instead of the alarm initiating circuit 250 and the reference voltage generating unit 270. The IC 200A forms an example of the crystal oscillator along with the crystal resonator 102.

The coil 50 is electrically connected to the IC 200A as illustrated in FIG. 8. The electrical connection between the IC 200A and the coil 50 can be realized in a similar form of the electrical connection between the excitation electrode 20 and the IC 200 in the Embodiment 1 described above.

The alarm initiating circuit 252 has a function (state before an output stop detecting function) of detecting a state (state before an output stop) before the crystal resonator 102 comes to an output stop. The alarm initiating circuit 252 is electrically connected to the coil 50. The state before an output stop detecting function of the alarm initiating circuit 252 is realized by monitoring a signal that appears in the coil 50. The alarm initiating circuit 252 initiates an alarm in a case where the amplitude (amplitude of a voltage waveform generated between both ends of the coil 50) (another example of the index value) of the signal that appears in the coil 50 is equal to or lower than a predetermined reference value β2. The reference value β2 is set to a value greater than amplitude Am of the signal that appears in the coil 50 when the amplitude of the input into the output buffer 208 is the input lower limit value. For example, the reference value β2 may satisfy β2=1.1×Am or β2>1.1×Am. The reference value β2 may be set in a similar form of the reference value β described above. That is, the reference value β2 may be set based on a design value of the input lower limit value of the output buffer 208 and a measured value (for example, a measured value of the amplitude Am) at a time of shipment.

The reference voltage generating unit 272 generates a voltage corresponding to the reference value β2 used by the alarm initiating circuit 252.

Figure 9A:
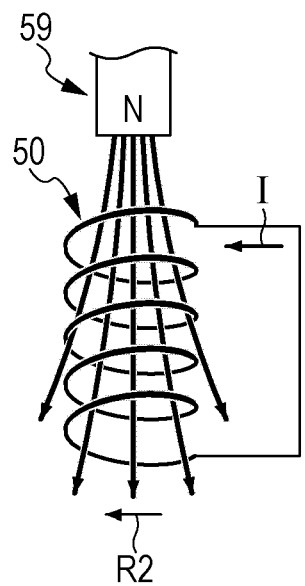
FIG. 9A is an explanatory diagram of a principle in which a current flows in a coil due to oscillation of the crystal oscillator.
Figure 9B:
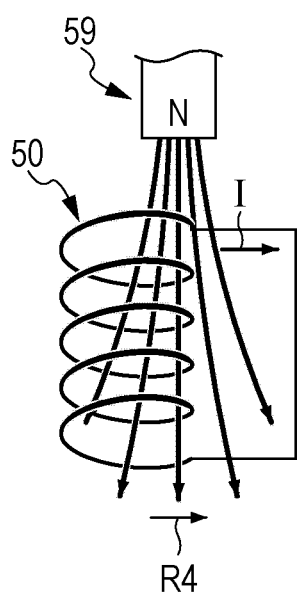
FIG. 9B is an explanatory diagram of the principle in which the current flows in the coil due to the oscillation of the crystal oscillator.
Figure 9C:
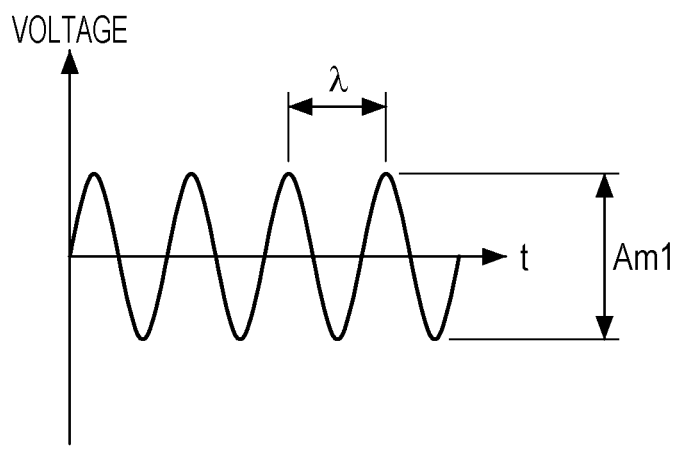
FIG. 9C is an explanatory diagram of a signal waveform that appears in the coil.
Figure 9D:
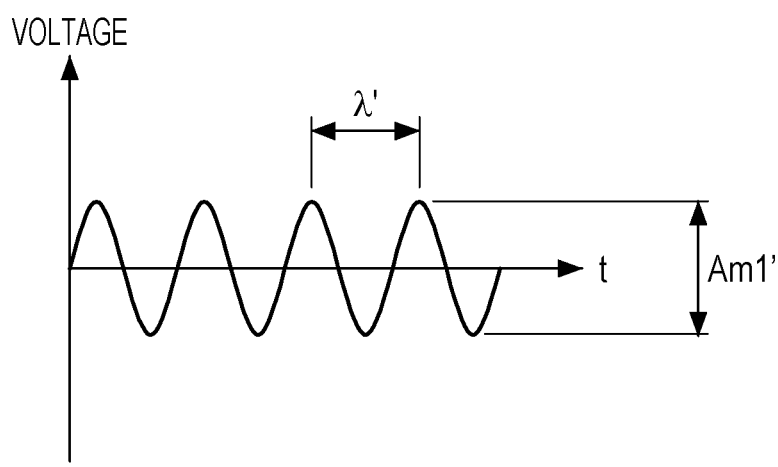
FIG. 9D is an explanatory diagram of the signal waveform that appears in the coil.

FIG. 9A and FIG. 9B are explanatory diagrams of a principle in which a current flows in the coil 50 due to the oscillation of the crystal oscillator. FIG. 9C and FIG. 9D are explanatory diagrams of a voltage waveform (time-series waveform of the signal that appears in the coil 50) that is generated between the both ends of the coil 50 in the crystal resonator 102 in the oscillation state. FIG. 9C illustrates a waveform in a case where the oscillation level of the crystal resonator 102 is in a normal state and FIG. 9D illustrates a waveform in a case where the oscillation level of the crystal resonator 102 is in a decline state.

When the crystal resonator 102 is in the oscillation state, the crystal piece 10 results in thickness shear oscillation (also referred to as "main oscillation") and the number of magnetic field lines passing through the coil 50 changes according to the oscillation of the crystal piece 10. Therefore, a voltage waveform that oscillates in a cycle according to the output frequency of the crystal resonator 102 is formed between the both ends of the coil 50 by electromagnetic induction. Specifically, during the thickness shear oscillation, the coil 50 is displaced (refer to an arrow R2) in one direction (parallel to the X-direction) from a center position of the thickness shear oscillation of the crystal piece 10 illustrated in FIG. 9A. At this time, since a direction in which the position of the coil 50 is displaced with respect to the magnet 59 is a direction in which the number of magnetic field lines passing the coil 50 decreases, a current I flows in the coil 50 in a direction where magnetic flux passing the coil 50 increases by electromagnetic induction. On the other hand, the coil 50 is displaced (refer to an arrow R4) in the other direction from a maximum displacement position of the thickness shear oscillation of the crystal piece 10 illustrated in FIG. 9B. At this time, since the direction in which the position of the coil 50 is displaced with respect to the magnet 59 is a direction in which the number of magnetic field lines passing the coil 50 increases, the current I (current opposite to FIG. 9A) flows in the coil 50 in a direction in which the magnetic flux passing the coil 50 diminishes by electromagnetic induction. In such a manner, a voltage waveform that oscillates in a cycle according to the output frequency of the crystal resonator 102 is generated between the both ends of the coil 50. The frequency and the amplitude of the voltage waveform generated between the both ends of the coil 50 decline along with a decline in the oscillation level of the crystal resonator 102, as illustrated in FIG. 9C and FIG. 9D. The amplitude declines since the amount of change in the number of magnetic field lines passing through the coil 50 becomes smaller along with a decline in the oscillation level of the crystal resonator 102. For example, in examples illustrated in FIG. 9C and FIG. 9D, once the oscillation level of the crystal resonator 102 transitions from the normal state to the decline state, a wavelength becomes longer from $\lambda$ to $\lambda'$ (that is, the output frequency declines) and the amplitude declines from Am1/2 to Am1'/2.

Figure 10A:
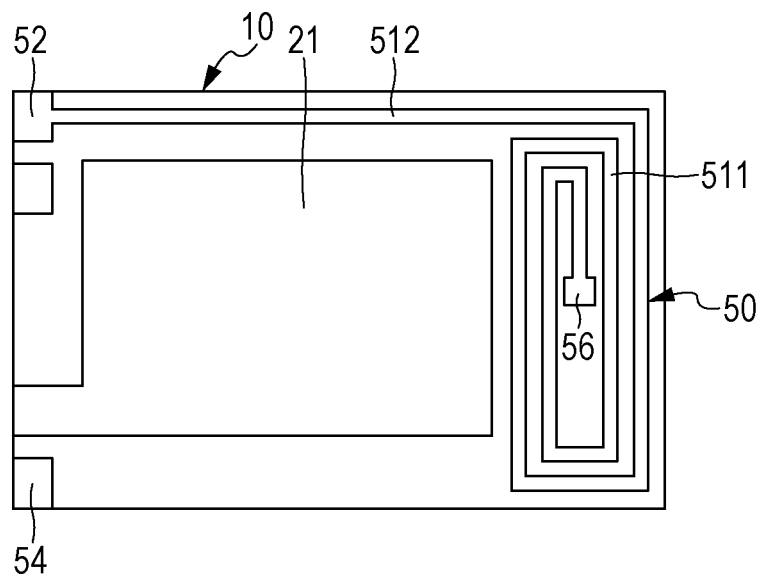
FIG. 10A is an explanatory diagram of a mounting example of the coil.
Figure 10B:
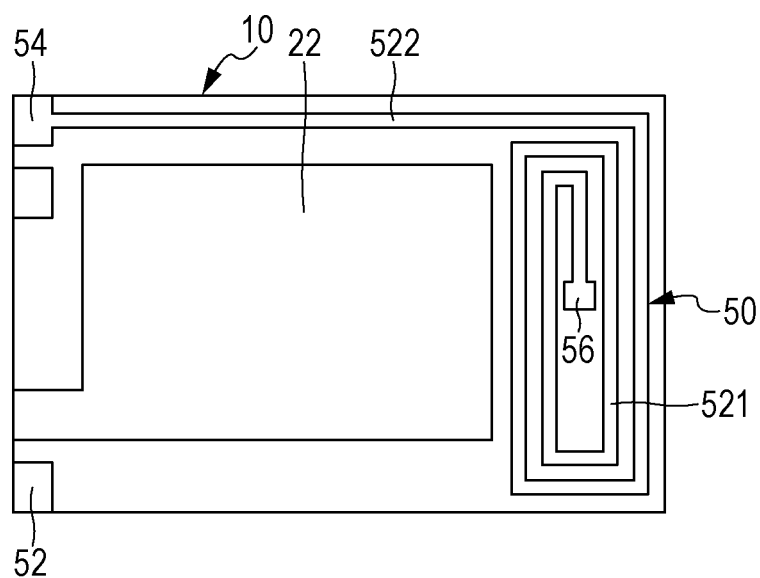
FIG. 10B is a diagram illustrating a lower outer surface of a crystal piece.

FIG. 10A is an explanatory diagram of a mounting example of the coil 50 and a plan view illustrating the upper outer surface of the crystal piece 10. FIG. 10B is a diagram illustrating the lower outer surface of the crystal piece 10.

In examples illustrated in FIGS. 10A and 10B, the coil 50 includes coil pattern sections 511 and 521, wiring sections 512 and 522, and a through hole 56. The coil pattern sections 511 and 521 are respectively formed on the upper outer surface and the lower outer surface of the crystal piece 10. By being wound a plurality of times, the coil pattern sections 511 and 521 are formed in a spiral from the through hole 56 in plan view (view in a direction perpendicular to the outer surface of the crystal piece 10). The coil pattern sections 511 and 521 are patterns that are wound in the same direction. One end (center side of winding) of each of the coil pattern sections 511 and 521 is electrically connected to each other via the through hole 56. The through hole 56 can be formed by etching the crystal piece 10. The other end of each of the coil pattern sections 511 and 521 is electrically connected to electrode 52 and electrode 54 respectively via the wiring sections 512 and 522. The wiring sections 512 and 522 are formed on the upper outer surface and the lower outer surface of the crystal piece 10 respectively. Each of the electrode 52 and the electrode 54 is electrically connected to the IC 200A.

Although the coil 50 is formed on both of the upper outer surface and the lower outer surface of the crystal piece 10 to increase the number of times being wound in examples illustrated in FIGS. 10A and 10B, the coil 50 may be formed on only one of the upper outer surface and the lower outer surface of the crystal piece 10. In addition, although the coil pattern sections 511 and 521 are wound a plurality of times to increase the number of times being wound in the examples illustrated in FIGS. 10A and 10B, the coil pattern sections 511 and 521 may be wound only once.

Figure 11A:
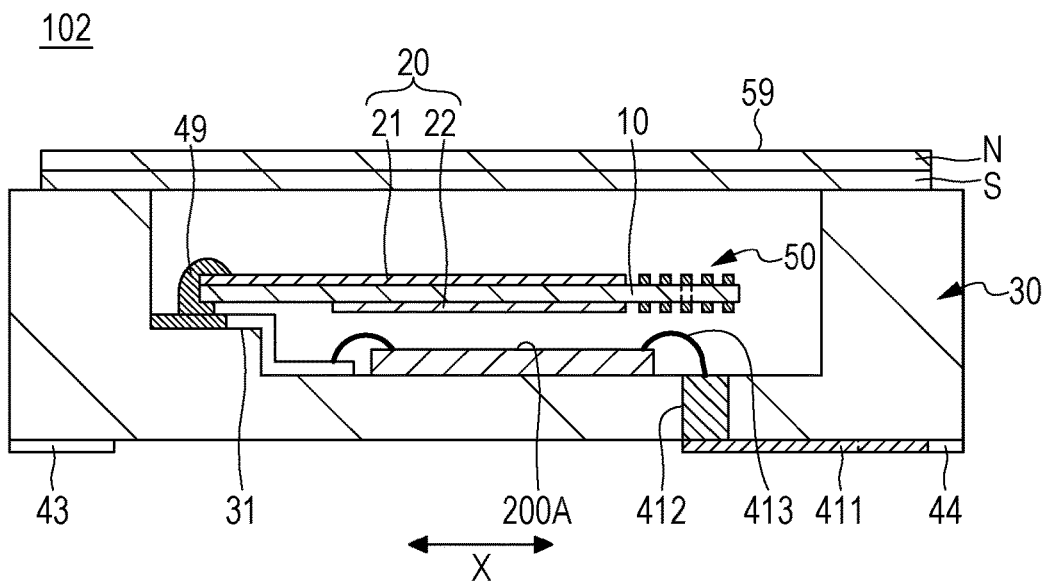
FIG. 11A is an explanatory diagram of a mounting example of a magnet.
Figure 11B:
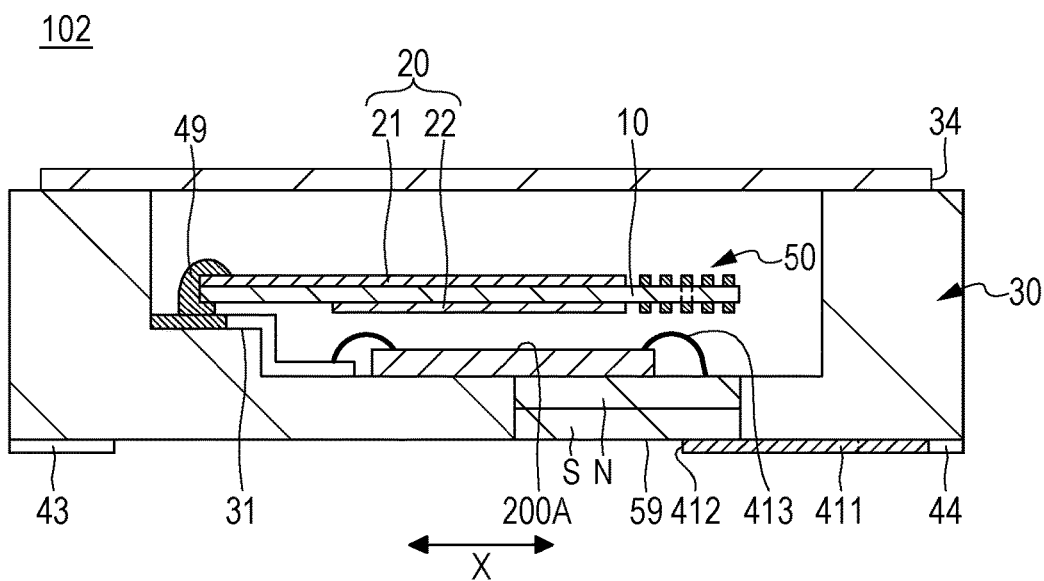
FIG. 11B is an explanatory diagram of another mounting example of the magnet.
Figure 11C:
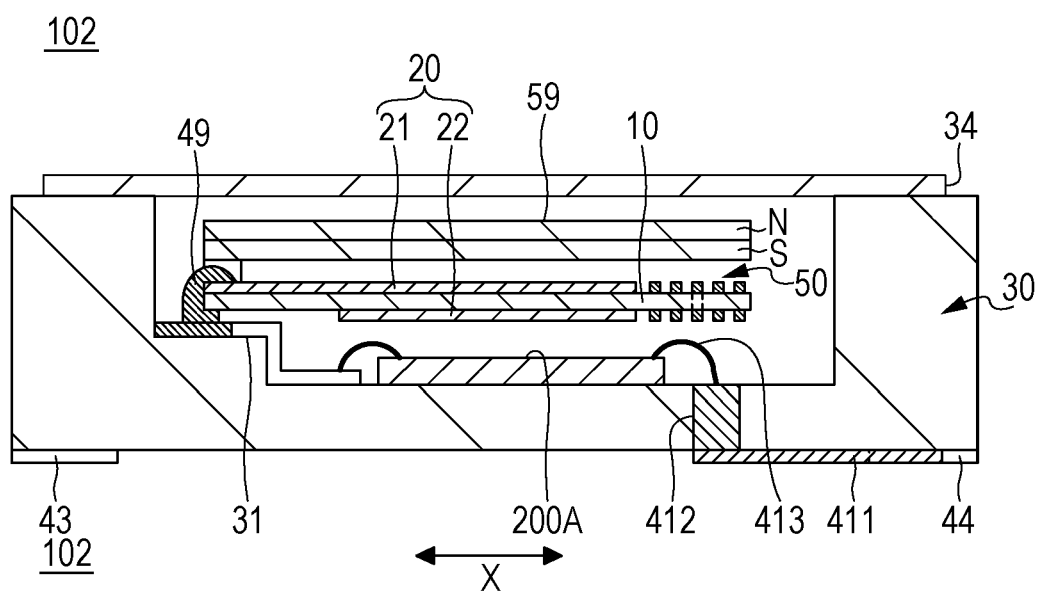
FIG. 11C is an explanatory diagram of still another mounting example of the magnet.

FIG. 11A to FIG. 11C are explanatory diagrams of a mounting example of the magnet 59 and rough sectional views of the crystal resonator 102. FIG. 11A to FIG. 11C correspond to sectional views taken along the line B-B in FIG. 1A. In FIG. 11A to FIG. 11C, the polarities (N-pole and S-pole) of the magnet 59 are schematically illustrated by "N" and "S". In addition, in FIG. 11A to FIG. 11C, the IC 200A is illustrated in addition to the crystal resonator 102.

In an example illustrated in FIG. 11A, the magnet 59 is provided in a form that functions as the lid 34. However, the magnet 59 may be provided on a part (for example, only a region in which the magnet 59 overlaps the coil pattern sections 511 and 521 in top view) of the lid 34 or may be formed by applying a magnetic flux generating material (for example, a magnetic material) onto the lid 34. Any one of the N-pole and the S-pole of the magnet 59 may be disposed on the upper side.

In an example illustrated in FIG. 11B, the magnet 59 is provided in a form such that the magnet 59 forms a part of the housing 30. The magnet 59 may be buried in the housing 30 as illustrated in FIG. 11B. However, the magnet 59 may also be formed by applying the magnetic flux generating material onto the housing 30. Any one of the N-pole and the S-pole of the magnet 59 may be disposed on the upper side.

In an example illustrated in FIG. 11C, the magnet 59 is provided in a form such that the magnet 59 is parallel to the outer surface of the crystal piece 10 and does not come into contact with the crystal piece 10. In this case, the magnet 59 may be in a form of a substrate or may be formed by applying the magnetic flux generating material onto the substrate. In addition, the magnet 59 may be supported by the housing 30 by using an appropriate supporting unit (not illustrated). Any one of the N-pole and the S-pole of the magnet 59 may be disposed on the upper side.

Even in the Embodiment 2, advantages similar to those of the Embodiment 1 may be obtained. That is, since the output of the crystal resonator 102 in the oscillation state can be monitored via the coil 50, the state before an output stop of the crystal resonator 102 can be similarly detected. Thus, at a time of the detection of the state before an output stop, an alarm can be initiated and a period until the gain of the inverting amplifier 206 is raised and the crystal resonator 102 comes to an output stop can be extended. In addition, according to the Embodiment 2, since the output of the crystal resonator 102 in the oscillation state can be electromagnetically monitored via the coil 50 and the magnet 59, a monitoring system independent of the oscillation circuit can be formed. Therefore, according to the Embodiment 2, the output of the crystal resonator 102 in the oscillation state can be monitored in a form that no effect is exerted on the oscillation circuit.

Although the functions of the alarm initiating circuit 252, the gain control circuit 260, and the reference voltage generating unit 272 are realized by the IC 200A in the Embodiment 2 described above, at least a part of the functions may be realized by a computer. For example, the functions of the alarm initiating circuit 252 and the gain control circuit 260 may be realized by a program being executed by a CPU of the computer and the function of the reference voltage generating unit 272 may be realized by a memory of the computer.

[Embodiment 3]

An Embodiment 3 is different from the Embodiment 1 described above in that the output of the crystal resonator in the oscillation state is electromagnetically monitored. That is, in the Embodiment 1 described above, the output of the crystal resonator in the oscillation state is monitored via the signal that appears at the point B (between the inverting amplifier 206 and the output buffer 208) within the oscillation circuit as described above. On the contrary, in the Embodiment 3, the output of the crystal resonator in the oscillation state is monitored, using a reception signal of an electromagnetic wave emitted due to the oscillation of the crystal resonator as will be described below.

Figure 12:
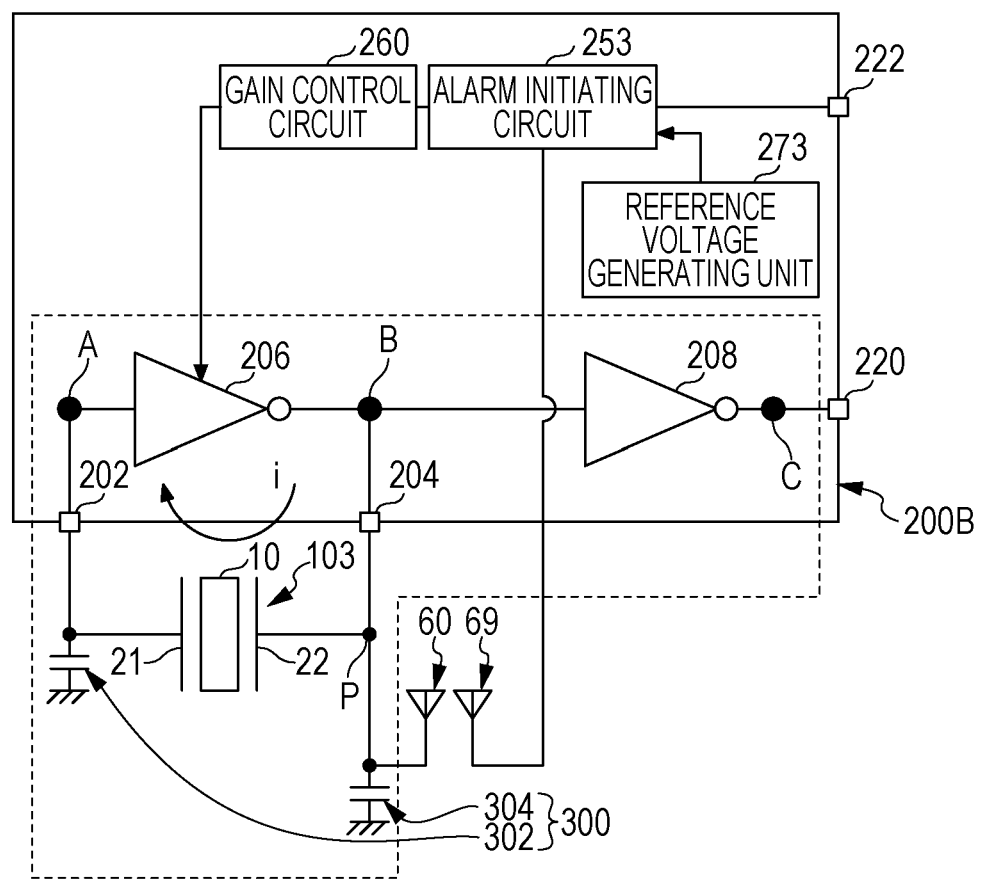
FIG. 12 is a diagram roughly illustrating an example of a circuit configuration of a crystal oscillator including a crystal resonator and an IC (Embodiment 3)

FIG. 12 is a diagram roughly illustrating an example of a circuit configuration of a crystal oscillator including a crystal resonator 103 and an IC 200B. In FIG. 12, with respect to the IC 200B, internal capacitance of a terminal, stray capacitance of a wiring pattern of a mount substrate, a resistance or the like that limits a current (refer to the arrow i of FIG. 12) that flows in the crystal resonator 103 are not illustrated. In FIG. 12, the same reference numerals will be attached to configuration elements that may be seen as the same as the configuration elements in the Embodiment 1 described above will be attached and description of the same configuration elements will not be repeated.

The crystal resonator 103 is different from the crystal resonator 100 according to the Embodiment 1 described above in that a transmission antenna 60 and a reception antenna 69 are added to the crystal resonator 103.

The transmission antenna 60 is electrically connected to any point within an oscillation circuit of the crystal resonator 103. For example, the transmission antenna 60 may be electrically connected between the inverting amplifier 206 and the output buffer 208 (refer to the point B of FIG. 12) within the oscillation circuit of the crystal resonator 103. In an example illustrated in FIG. 12, the transmission antenna 60 is electrically connected between a point P between the lower excitation electrode 22 and the point B and the second capacitor 304. The transmission antenna 60 may be formed in the crystal piece 10 or the housing 30 and the reception antenna 69 may be provided in the crystal piece 10 or the housing 30. In this case, the transmission antenna 60 may be formed as an antenna pattern on the upper outer surface and/or the lower outer surface of the crystal piece 10 (refer to FIG. 13). In addition, the reception antenna 69 may be formed as the antenna pattern in the housing 30 in a form of being positioned in the vicinity of the transmission antenna 60 (refer to FIG. 13).

The transmission antenna 60 transmits the electromagnetic wave corresponding to an output waveform of the crystal resonator 103. That is, in a state where the crystal resonator 103 oscillates at a certain frequency, an electric field (electromagnetic wave transmitted by a standing wave) is generated in the transmission antenna 60 at this frequency. That is, when the crystal resonator 103 is in the oscillation state, the electromagnetic wave is transmitted (emitted) from the transmission antenna 60 by the standing wave being formed in the transmission antenna 60 based on the current related to the output of the crystal resonator 103. Therefore, the electromagnetic wave transmitted from the transmission antenna 60 oscillates with amplitude according to the oscillation level of the crystal resonator 103. The reception antenna 69 receives the electromagnetic wave transmitted from the transmission antenna 60. Therefore, the amplitude of a reception signal of the electromagnetic wave generated in the transmission antenna 60 declines along with a decline in the oscillation level of the crystal resonator 103.

The IC 200B is different from the IC 200 according to the Embodiment 1 described above in that the IC 200B does not have the amplifier for monitoring 240 and is provided with each of an alarm initiating circuit 253 and a reference voltage generating unit 273 instead of the alarm initiating circuit 250 and the reference voltage generating unit 270. The IC 200B forms an example of the crystal oscillator along with the crystal resonator 103.

The reception antenna 69 is electrically connected to the IC 200B as illustrated in FIG. 12. The electrical connection between the IC 200B and the reception antenna 69 can be realized in a form similar to the electrical connection between the excitation electrode 20 and the IC 200 in the Embodiment 1 described above.

The alarm initiating circuit 253 has a function (state before an output stop detecting function) of detecting a state (state before an output stop) before the crystal resonator 103 comes to an output stop. The alarm initiating circuit 253 is electrically connected to the reception antenna 69. The alarm initiating circuit 253 realizes the state before an output stop detecting function by monitoring a signal received from the reception antenna 69. The alarm initiating circuit 253 initiates an alarm in a case where the amplitude (another example of the index value) of the signal received by the reception antenna 69 is equal to or lower than a predetermined reference value $\beta 3$. The reference value $\beta 3$ is set to a value greater than amplitude Bm of the signal received by the reception antenna 69 when the amplitude of the input into the output buffer 208 is the input lower limit value. For example, the reference value $\beta 3$ may satisfy $\beta 3 = 1.1 \times Bm$ or $\beta 3 > 1.1 \times Bm$. The reference value $\beta 3$ may be set in a form similar to the reference value $\beta$ described above. That is, the reference value $\beta 3$ may be set based on the design value of the input lower limit value of the output buffer 208 and the measured value at a time of shipment (for example, measured value of the amplitude Bm).

The reference voltage generating unit 273 generates a voltage corresponding to the reference value $\beta 3$ used by the alarm initiating circuit 253.

Figure 13:
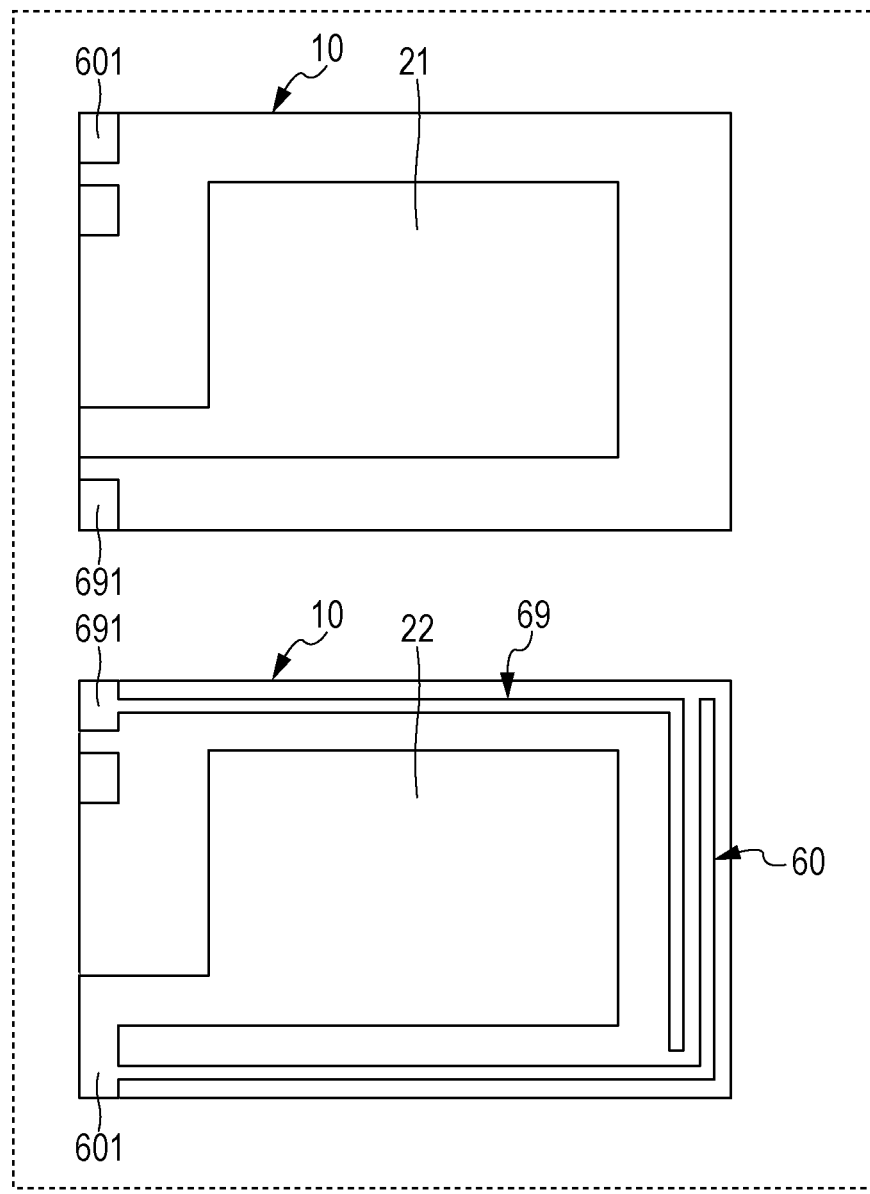
FIG. 13 is an explanatory diagram of mounting examples of a transmission antenna and a reception antenna.

FIG. 13 is an explanatory diagram of mounting examples of the transmission antenna 60 and the reception antenna 69 and is a two-side diagram (plan view illustrating an upper outer surface and a lower outer surface) of the crystal piece 10.

In an example illustrated in FIG. 13, each of the transmission antenna 60 and the reception antenna 69 is provided on lower outer surface of the crystal piece 10. One end of each pattern of the transmission antenna 60 and the reception antenna 69 forms an open end. The other end of each pattern of the transmission antenna 60 and the reception antenna 69 is electrically connected to electrodes 601 and 691 respectively. The electrode 601 is electrically connected to an electrode (for example, an electrode bonded to the housing 30 with a conductive adhesive) related to the lower excitation electrode 22.

Although the transmission antenna 60 and the reception antenna 69 are formed on both sides of the lower outer surface of the crystal piece 10 in the example illustrated in FIG. 13, the transmission antenna 60 and the reception antenna 69 may be formed on upper outer surface of the crystal piece 10. In addition, in the example illustrated in FIG. 13, the transmission antenna 60 is electrically connected to the electrode related to the lower excitation electrode 22 on an output side of the crystal resonator 103 to heighten the strength of the electromagnetic wave from the transmission antenna 60. As described above, that is because the amplitude of the signal on the output side of the crystal resonator 103 is greater since the signal is amplified by the inverting amplifier 206 on an input side and the output side of the crystal resonator 103. However, the transmission antenna 60 may be electrically connected to the input side of the crystal resonator 103.

Even in the Embodiment 3, advantages similar to those of the Embodiment 1 may be obtained. That is, since the output of the crystal resonator 103 in the oscillation state can be monitored via the transmission antenna 60 and the reception antenna 69, the state before an output stop of the crystal resonator 103 can be similarly detected. Thus, at a time of the detection of the state before an output stop, an alarm can be initiated and a period until the gain of the inverting amplifier 206 is raised and the crystal resonator 103 comes to an output stop can be extended.

Although the functions of the functions of the alarm initiating circuit 253, the gain control circuit 260, and the reference voltage generating unit 273 are realized by the IC 200B in the Embodiment 3 described above, at least a part of the functions may be realized by a computer. For example, the functions of the alarm initiating circuit 253 and the gain control circuit 260 may be realized by a program being executed by a CPU of the computer and the function of the reference voltage generating unit 273 may be realized by a memory of the computer.

[Embodiment 4]

An Embodiment 4 is different from the Embodiment 1 described above in that the output of the crystal resonator in the oscillation state is electromagnetically monitored. That is, in the Embodiment 1 described above, the output of the crystal resonator in the oscillation state is monitored via the signal that appears at the point B (between the inverting amplifier 206 and the output buffer 208) within the oscillation circuit as described above. On the contrary, in the Embodiment 4, the output of the crystal resonator in the oscillation state is monitored, using a signal that appears in a coil, in which the number of magnetic field lines passing through the coil changes according the oscillation of the crystal resonator as will be described below.

Figure 14:
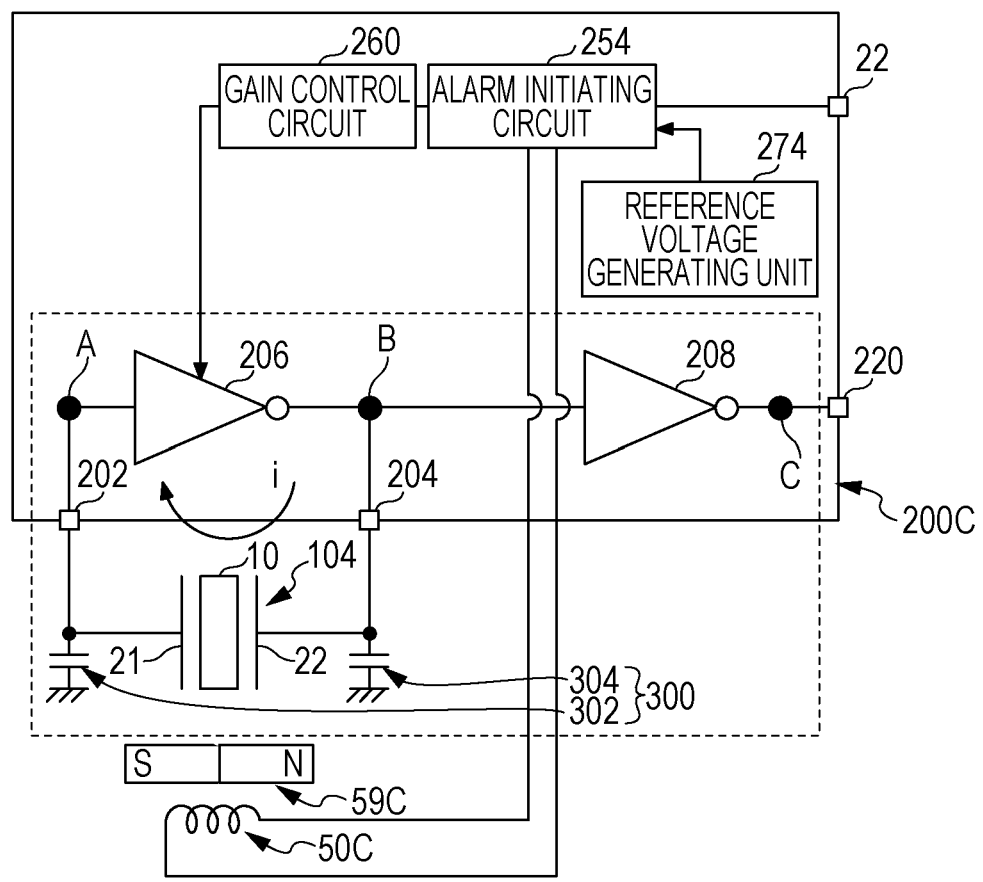
FIG. 14 is a diagram roughly illustrating an example of a circuit configuration of a crystal oscillator including a crystal resonator and an IC (Embodiment 4)

FIG. 14 is a diagram roughly illustrating an example of a circuit configuration of a crystal oscillator including a crystal resonator 104 and an IC 200C. In FIG. 14, with respect to the IC 200C, internal capacitance of a terminal, stray capacitance of a wiring pattern of a mount substrate, a resistance or the like that limits a current (refer to the arrow i of FIG. 14) that flows in the crystal resonator 104 are not illustrated. In FIG. 14, the same reference numerals will be attached to configuration elements that may be seen as the same as the configuration elements in the Embodiment 1 described above will be attached and description of the same configuration elements will not be repeated.

The crystal resonator 104 is different from the crystal resonator 100 according to the Embodiment 1 described above in that a coil 50C and a magnet 59C (an example of the magnetic flux generating member) are added to the crystal resonator 104.

The coil 50C and the magnet 59C are provided in the crystal resonator 104 such that the number of magnetic field lines formed from the magnet 59C, which is the number of magnetic field lines passing through the coil 50C, changes according to the oscillation of the crystal resonator 104. For example, the coil 50C may be formed in the crystal piece 10 or the housing 30 and the magnet 59C may be provided in the crystal piece 10. In this case, the coil 50C may be formed as a coil pattern in the crystal piece 10 or the housing 30 (refer to FIG. 15). In addition, the magnet 59C may be placed on the crystal piece 10 (refer to FIG. 15). In addition, the magnet 59C may be formed of, for example, a permanent magnet.

The IC 200C is different from the IC 200 according to the Embodiment 1 described above in that the IC 200C does not have the amplifier for monitoring 240 and is provided with each of an alarm initiating circuit 254 and a reference voltage generating unit 274 instead of the alarm initiating circuit 250 and the reference voltage generating unit 270. The IC 200C forms an example of the crystal oscillator along with the crystal resonator 104.

The coil 50C is electrically connected to the IC 200C as illustrated in FIG. 14. The electrical connection between the IC 200C and the coil 50C can be realized in a form similar to the electrical connection between the excitation electrode 20 and the IC 200 in the Embodiment 1 described above.

The alarm initiating circuit 254 has a function (state before an output stop detecting function) of detecting a state (state before an output stop) before the crystal resonator 104 comes to an output stop. The alarm initiating circuit 254 is electrically connected to the coil 50C. The alarm initiating circuit 254 realizes the state before an output stop detecting function by monitoring a signal that appears in the coil 50C. The alarm initiating circuit 254 initiates an alarm in a case where the amplitude (amplitude of a voltage waveform generated between both ends of the coil 50C) (another example of the index value) of the signal that appears in the coil 50C is equal to or lower than a predetermined reference value $\beta 4$. The reference value $\beta 4$ is set to a value greater than amplitude Cm of the signal that appears in the coil 50C when the amplitude of the input into the output buffer 208 is the input lower limit value. For example, the reference value $\beta 4$ may satisfy $\beta 4 = 1.1 \times Cm$ or $\beta 4 > 1.1 \times Cm$. The reference value $\beta 4$ may be set in a form similar to the reference value $\beta$ described above. That is, the reference value $\beta 4$ may be set based on the design value of the input lower limit value of the output buffer 208 and the measured value at a time of shipment (for example, a measured value of the amplitude Cm).

The reference voltage generating unit 274 generates a voltage corresponding to the reference value $\beta 4$ used by the alarm initiating circuit 254.

When the crystal resonator 104 is in the oscillation state, the crystal piece 10 results in the thickness shear oscillation and the number of magnetic field lines passing through the coil 50C changes according to the oscillation of the crystal piece 10. This principle is practically the same as the principle (refer to FIG. 9A and FIG. 9B) described in the Embodiment 2 described above. Therefore, a voltage waveform that oscillates in a cycle according to the output frequency of the crystal resonator 104 is generated between the both ends of the coil 50C by electromagnetic induction. The frequency and the amplitude of the voltage waveform generated between the both ends of the coil 50C decline along with a decline in the oscillation level of the crystal resonator 104.

Figure 15:
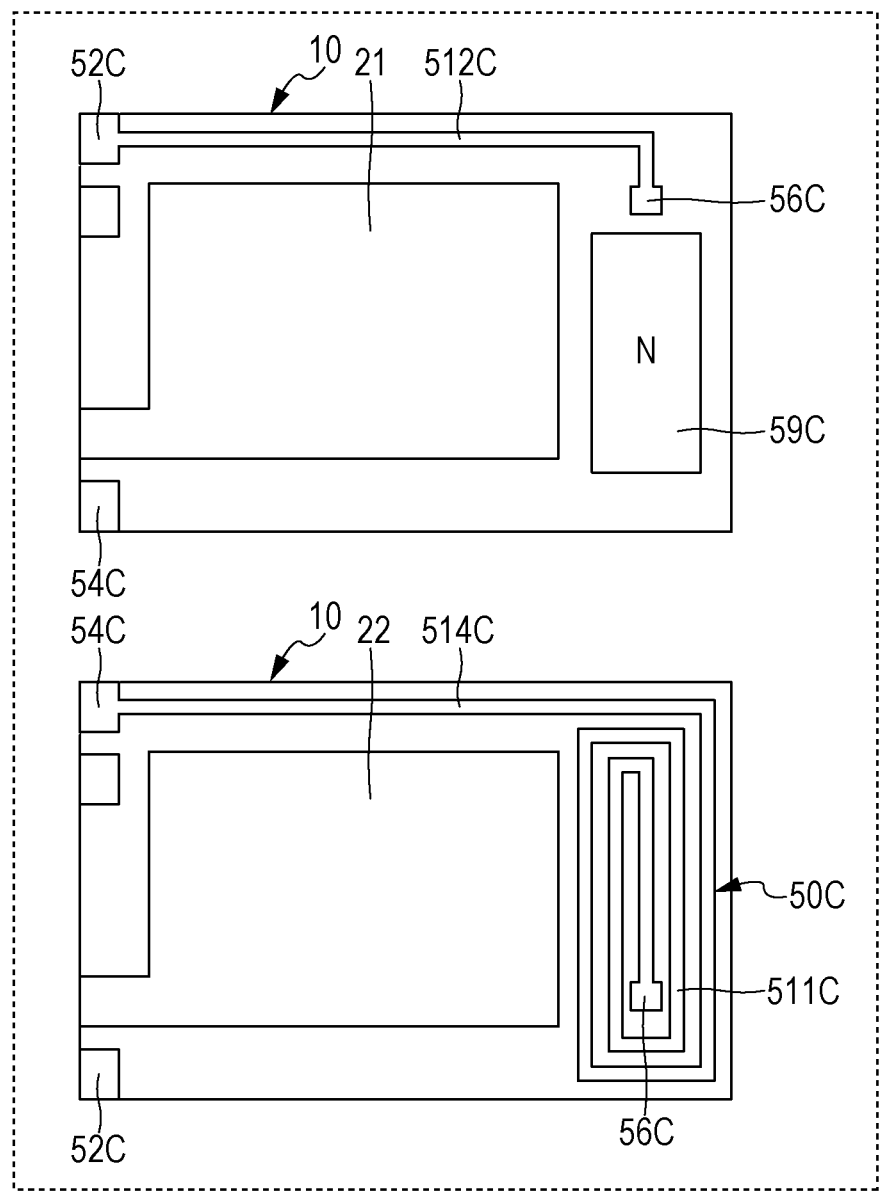
FIG. 15 is an explanatory diagram of mounting examples of a coil and a magnet.
Figure 16:
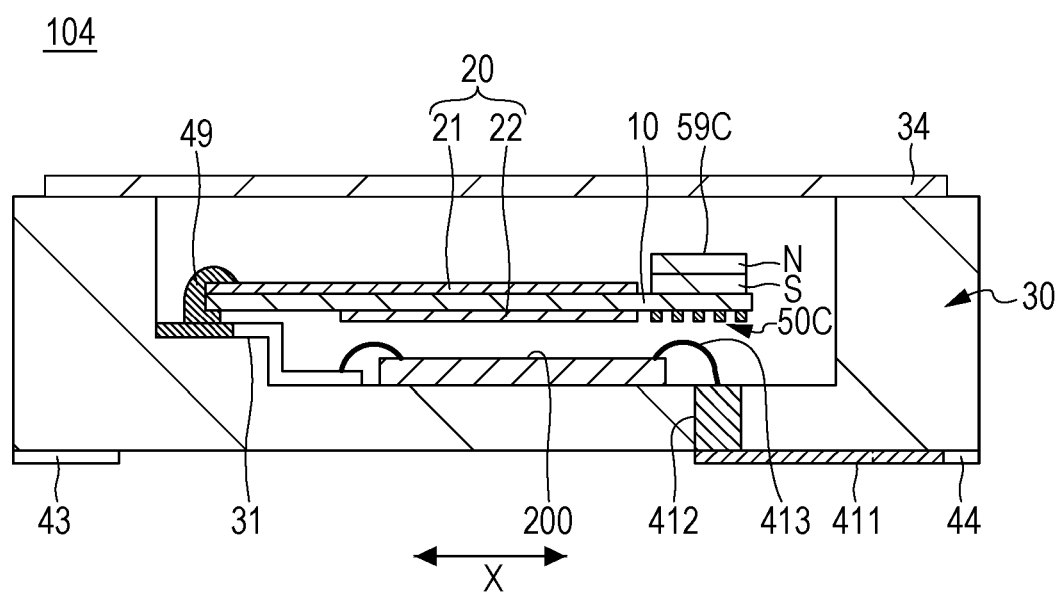
FIG. 16 is a rough sectional view of the crystal resonator.

FIG. 15 is an explanatory diagram of mounting examples of the coil 50C and the magnet 59C and is a two-side diagram (plan view illustrating an upper outer surface and a lower outer surface) of the crystal piece 10. FIG. 16 is a rough sectional view of the crystal resonator 104. FIG. 16 corresponds to a sectional view taken along the line B-B in FIG. 1A. In FIG. 15 and FIG. 16, the polarities (N-pole and S-pole) of the magnet 59C are schematically illustrated by "N" and "S". In FIG. 15, the IC 200C is illustrated in addition to the crystal resonator 104.

In an example illustrated in FIG. 15, the coil 50C includes a coil pattern section 511C, wiring sections 512C and 514C, and a through hole 56C. The coil pattern section 511C is formed on the lower outer surface of the crystal piece 10. By being wound a plurality of times, the coil pattern section 511C is formed in a spiral from the through hole 56C in plan view (view in the direction perpendicular to the outer surface of the crystal piece 10). One end (center side of winding) of the coil pattern section 511C is pulled out to the upper outer surface of the crystal piece 10 via the through hole 56C and is electrically connected to an electrode 52C via the wiring section 512C. The through hole 56C can be formed by etching the crystal piece 10. The other end of the coil pattern section 511C is electrically connected to an electrode 54C via the wiring section 514C. The wiring section 512C and the wiring section 514C are respectively formed on the upper outer surface and the lower outer surface of the crystal piece 10. Each of the electrode 52C and the electrode 54C is electrically connected to the IC 200C.

In addition, in the example illustrated in FIG. 15, the magnet 59C is placed on the upper outer surface of the crystal piece 10. The magnet 59C is provided in a region where the magnet 59C overlaps the coil 50C in plan view (view in the direction perpendicular to the outer surface of the crystal piece 10). The magnet 59C may be provided at a position where the number of magnetic field lines passing through the coil 50C is maximum in the neutral state (for example, the state in which the crystal piece 10 does not oscillate) of the crystal piece 10.

Although the coil 50C is formed on the lower outer surface of the crystal piece 10 in the example illustrated in FIG. 15, the coil 50C may be formed on the upper outer surface of the crystal piece 10. In this case, the magnet 59C is provided on the lower outer surface of the crystal piece 10. In addition, although the coil pattern section 511C is wound a plurality of times to increase the number of times being wound in the example illustrated in FIG. 15, the coil pattern section 511C may be wound only once. In addition, although the coil pattern section 511C is formed on the crystal piece 10 in the example illustrated in FIG. 15, the coil pattern section 511C may be formed in the housing 30 (including the lid 34). In addition, although the magnet 59C is provided in the region where the excitation electrode 20 is not provided in the crystal piece 10 in the example illustrated in FIG. 15, the magnet 59C is not limited to being provided in the region where the excitation electrode 20 is not provided. For example, the magnet 59C may be provided in any one of the upper excitation electrode 21 and the lower excitation electrode 22. This is because displacement in a reverse front-and-back direction occurs and a magnetic field change is cancelled out in the thickness shear oscillation of a general crystal resonator. In this case, the magnet 59C may be formed by applying the magnetic flux generating material onto any one of the upper excitation electrode 21 and the lower excitation electrode 22 or any one of the upper excitation electrode 21 and the lower excitation electrode 22 may be formed of the magnetic flux generating material. Any one of the N-pole and the S-pole of the magnet 59C may be disposed on the upper side.

Even in the Embodiment 4, advantages similar to those of the Embodiment 1 may be obtained. That is, since the output of the crystal resonator 104 in the oscillation state is monitored via the coil 50C, the state before an output stop of the crystal resonator 104 can be similarly detected. Thus, at a time of the detection of the state before an output stop, an alarm can be initiated and a period until the gain of the inverting amplifier 206 is raised and the crystal resonator 104 comes to an output stop can be extended. In addition, according to the Embodiment 4, since the output of the crystal resonator 104 in the oscillation state can be electromagnetically monitored via the coil 50C and the magnet 59C, a monitoring system independent of the oscillation circuit can be formed. Therefore, according to the Embodiment 4, the output of the crystal resonator 104 in the oscillation state can be monitored in a form that does not have an effect on the oscillation circuit.

Although the functions of the alarm initiating circuit 254, the gain control circuit 260, and the reference voltage generating unit 274 are realized by the IC 200C in the Embodiment 4 described above, at least a part of the functions may be realized by a computer. For example, the functions of the alarm initiating circuit 254 and the gain control circuit 260 may be realized by a program being executed by a CPU of the computer and the function of the reference voltage generating unit 274 may be realized by a memory of the computer.

[Embodiment 5]

An Embodiment 5 is different from the Embodiment 1 described above in that the output of the crystal resonator in the oscillation state is electrically and indirectly monitored. That is, in the Embodiment 1 described above, the output related to the main oscillation of the crystal resonator in the oscillation state is directly monitored as described above. On the contrary, in the Embodiment 5, the output related to the main oscillation of the crystal resonator in the oscillation state is monitored, using output caused by sub-oscillation of the crystal resonator as will be described below.

Figure 17:
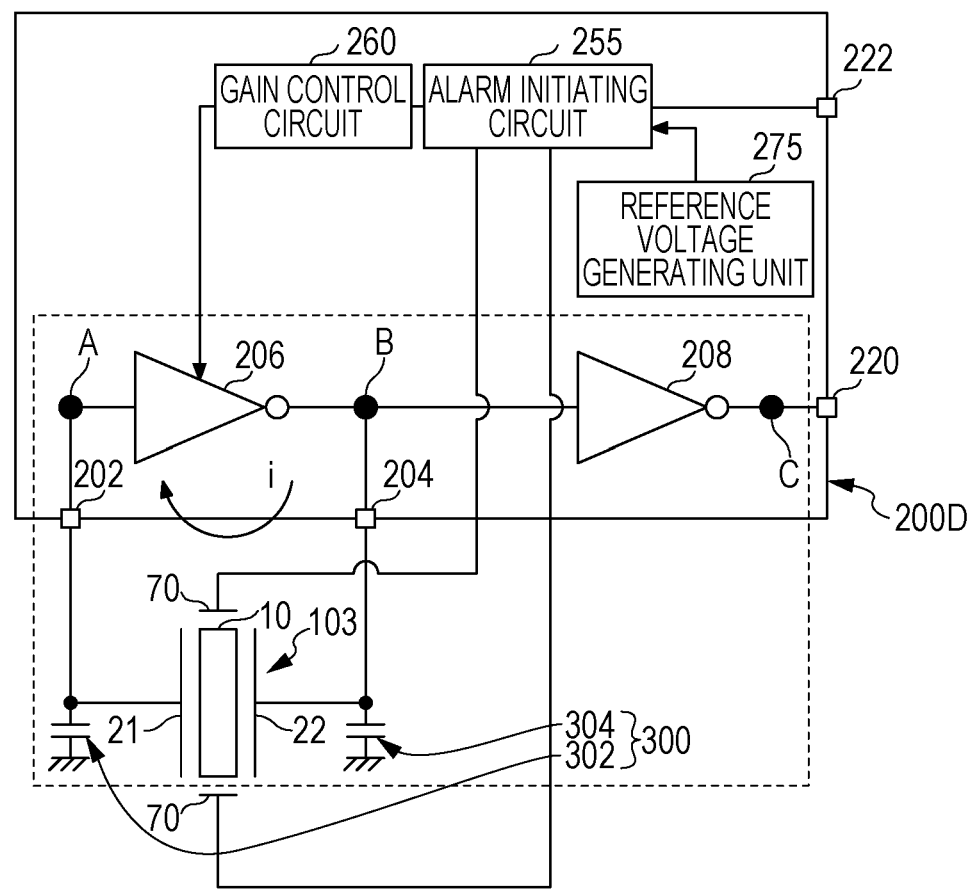
FIG. 17 is a diagram roughly illustrating an example of a circuit configuration of a crystal oscillator including a crystal resonator and an IC (Embodiment 5)

FIG. 17 is a diagram roughly illustrating an example of a circuit configuration of a crystal oscillator including a crystal resonator 105 and an IC 200D. In FIG. 17, with respect to the IC 200D, internal capacitance of a terminal, stray capacitance of a wiring pattern of a mount substrate, a resistance or the like that limits a current (refer to the arrow i of FIG. 17) that flows in the crystal resonator 105 are not illustrated. In FIG. 17, the same reference numerals will be attached to configuration elements that may be seen as the same as the configuration elements in the Embodiment 1 described above will be attached and description of the same configuration elements will not be repeated.

The crystal resonator 105 is different from the crystal resonator 100 according to the Embodiment 1 described above in that an electrode for sub-oscillation 70 is added to the crystal resonator 105.

The electrode for sub-oscillation 70 is disposed such that the electrode for sub-oscillation 70 can detect (pick up) an alternating electric field which is generated due to sub-oscillation of the crystal resonator 105 in the oscillation state. For example, the electrode for sub-oscillation 70 may be formed in the crystal piece 10 or the housing 30 (refer to FIG. 18A and FIG. 18B). In addition to the thickness shear oscillation (main oscillation) of the crystal piece 10, the sub-oscillation occurs in the crystal resonator 105 in the oscillation state. For example, since the sub-oscillation is accompanied by changes in the contour of the crystal piece 10, the sub-oscillation is referred to as contour oscillation. In the Embodiment 5, as an example, the electrode for sub-oscillation 70 is disposed such that the electrode for sub-oscillation 70 can detect the alternating electric field generated due to the contour oscillation of the crystal resonator 105 (refer to FIG. 18A and FIG. 18B). When the crystal resonator 105 is in the oscillation state, the crystal piece 10 results in the sub-oscillation and the level of the sub-oscillation substantially correlates with the level of the main oscillation since the level of the sub-oscillation is meaningfully lower than the level of the main oscillation. That is, once the level of the main oscillation declines, the level of the sub-oscillation declines along with the decline in the level of the main oscillation. Therefore, the amplitude of a signal that appears in the electrode for sub-oscillation 70 declines along with the decline in the oscillation level of the crystal resonator 105.

The IC 200D is different from the IC 200 according to the Embodiment 1 described above in that the IC 200D does not have the amplifier for monitoring 240 and is provided with each of an alarm initiating circuit 255 and a reference voltage generating unit 275 instead of the alarm initiating circuit 250 and the reference voltage generating unit 270. The IC 200D forms an example of the crystal oscillator along with the crystal resonator 105.

The electrode for sub-oscillation 70 is electrically connected to the IC 200D as illustrated in FIG. 17. The electrical connection between the IC 200D and the electrode for sub-oscillation 70 can be realized in a form similar to the electrical connection between the excitation electrode 20 and the IC 200 in the Embodiment 1 described above.

The alarm initiating circuit 255 has a function (state before an output stop detecting function) of detecting a state (state before an output stop) before the crystal resonator 105 comes to an output stop. The alarm initiating circuit 255 is electrically connected to the electrode for sub-oscillation 70. The alarm initiating circuit 255 realizes the state before an output stop detecting function by monitoring the signal that appears in the electrode for sub-oscillation 70. The alarm initiating circuit 255 initiates an alarm in a case where the amplitude of the signal that appears in the electrode for sub-oscillation 70 (another example of the index value) is equal to or lower than a predetermined reference value $\beta 5$. The reference value $\beta 5$ is set to a value greater than amplitude Dm of the signal that appears in the electrode for sub-oscillation 70 when the amplitude of the input into the output buffer 208 is the input lower limit value. For example, the reference value $\beta 5$ may satisfy $\beta 5 = 1.1 \times Dm$ or $\beta 5 > 1.1 \times Dm$. The reference value $\beta 5$ may be set in a form similar to the reference value $\beta$ described above. That is, the reference value $\beta 5$ may be set based on the design value of the input lower limit value of the output buffer 208 and the measured value at a time of shipment (for example, a measured value of the amplitude Dm).

The reference voltage generating unit 275 generates a voltage corresponding to the reference value $\beta 5$ used by the alarm initiating circuit 255.

Figure 18A:
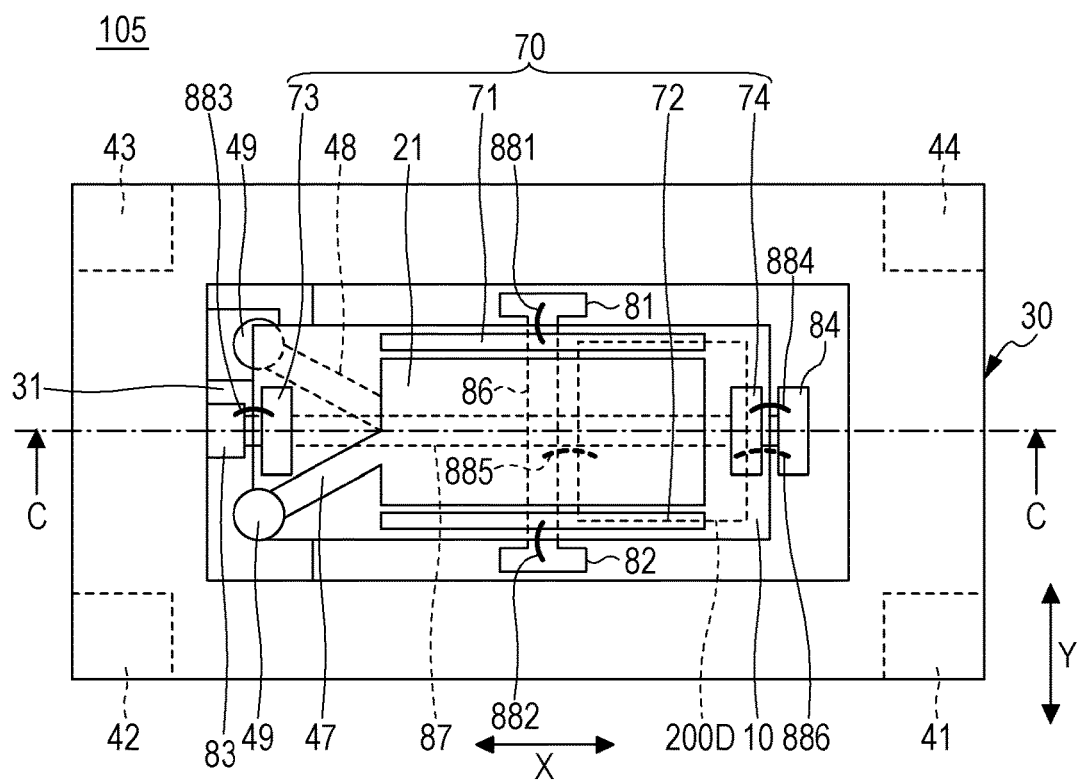
FIG. 18A is a top view roughly illustrating the crystal resonator according to the Embodiment 5.
Figure 18B:
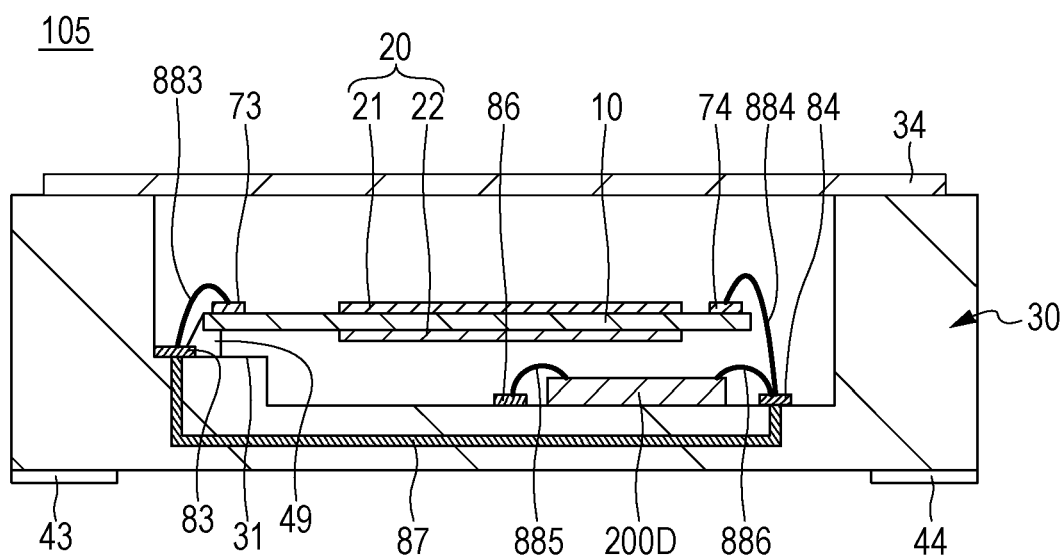
FIG. 18B is a sectional view taken along line C-C in FIG. 18A.

FIG. 18A is a top view roughly illustrating the crystal resonator 105 according to the Embodiment 5 and FIG. 18B is a rough sectional view taken along line C-C in FIG. 18A. In FIG. 18A, to make it easier to view, a part of wiring that realizes the electrical connection between the IC 200D and the excitation electrode 20 is not illustrated. The electrical connection between the IC 200D and the excitation electrode 20 can be realized similarly to the electrical connection between the IC 200 and the excitation electrode 20 according to the Embodiment 1 described above. In FIG. 18A and FIG. 18B, the IC 200D is illustrated in addition to the crystal resonator 105.

In the following description, a Y-direction is a direction parallel to the outer surface of the crystal piece 10 and is defined as a direction perpendicular to a main oscillation direction of the crystal resonator 105 as illustrated in FIG. 18A.

The electrode for sub-oscillation 70 includes first to fourth sub-electrodes 71 to 74. The first to fourth sub-electrodes 71 to 74 are provided on the outer surface of the crystal piece 10. The first to fourth sub-electrodes 71 to 74 are provided nearby the upper excitation electrode 21 so as to be spaced away from the upper excitation electrode 21. The electrode for sub-oscillation 70 is electrically connected to the IC 200D. The electrical connection between the electrode for sub-oscillation 70 and the IC 200D may be realized with any method.

In examples illustrated in FIG. 18A and FIG. 18B, the first to fourth sub-electrodes 71 to 74 are formed as follows. The first to fourth sub-electrodes 71 to 74 are provided on the upper outer surface of the crystal piece 10. The first sub-electrode 71 and the second sub-electrode 72 are disposed so as to have a relationship in which the upper excitation electrode 21 is interposed between the first sub-electrode 71 and the second sub-electrode 72 in the Y-direction. The third sub-electrode 73 and the fourth sub-electrode 74 are disposed so as to have a relationship in which the upper excitation electrode 21 is interposed between the third sub-electrode 73 and the fourth sub-electrode 74 in the X-direction. The first sub-electrode 71 is electrically connected to a first housing-side electrode 81 formed on the internal surface (outer surface on a housing inner portion side) of the lower portion of the housing 30 via a wire 881 by wire bonding. In a similar manner, the second sub-electrode 72 and the fourth sub-electrode 74 are electrically connected to a second housing-side electrode 82 and a fourth housing-side electrode 84, respectively, which are formed on the internal surface (outer surface on the housing inner portion side) of the lower portion of the housing 30, via wires 882 and 884. The third sub-electrode 73 is electrically connected to a third housing-side electrode 83 formed in the bank section 31 via a wire 883 by wire bonding. The second housing-side electrode 82 is electrically connected to the first housing-side electrode 81 via a conductor pattern 86 formed on the internal surface of the lower portion of the housing 30. The conductor pattern 86 is electrically connected to the IC 200D via a wire 885 by wire bonding. Accordingly, the first sub-electrode 71 and the second sub-electrode 72 are electrically connected to the IC 200D. The fourth housing-side electrode 84 is electrically connected to the third housing-side electrode 83 via a conductor pattern 87 formed in an inner layer of the housing 30. The fourth housing-side electrode 84 is electrically connected to the IC 200D via a wire 886 by wire bonding. Accordingly, the third sub-electrode 73 and the fourth sub-electrode 74 are electrically connected to the IC 200D.

Figure 19:
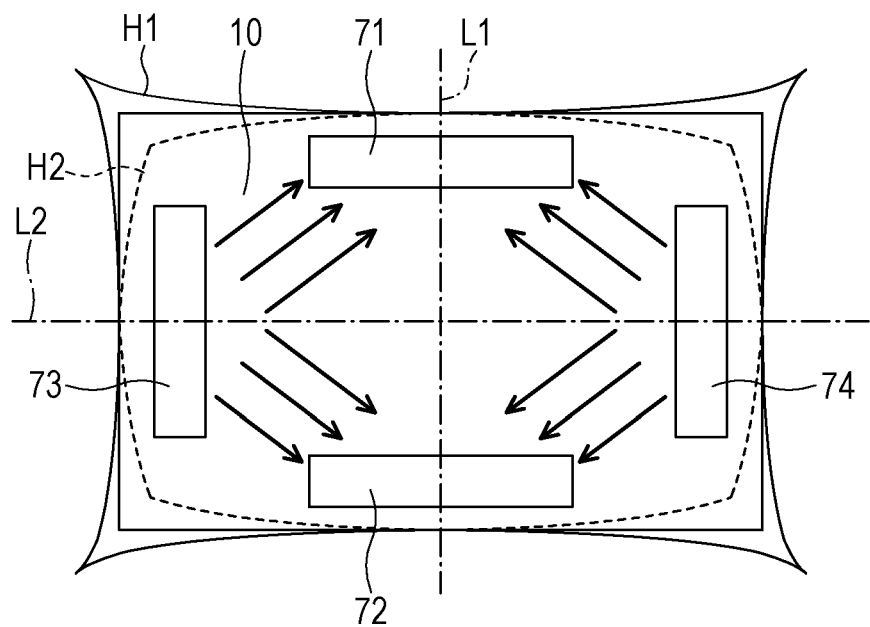
FIG. 19 is an explanatory diagram of sub-oscillation.

FIG. 19 is an explanatory diagram of the sub-oscillation and is a view roughly illustrating only the crystal piece 10 and the electrode for sub-oscillation 70 in top view. In FIGS. 19, H1 and H2 schematically represent changes in the appearance (contour) of the crystal piece 10 caused by displacement due to the sub-oscillation. In addition, in FIG. 19, arrows between the first to fourth sub-electrodes 71 to 74 indicate directions of an electric field generated between the first to fourth sub-electrodes 71 to 74 at certain timing of the crystal resonator 105 in the oscillation state.

In the crystal resonator 105 in the oscillation state, an alternating electric field is generated between the first sub-electrode 71 and the third sub-electrode 73, between the first sub-electrode 71 and the fourth sub-electrode 74, between the second sub-electrode 72 and the third sub-electrode 73, and between the second sub-electrode 72 and the fourth sub-electrode 74. The arrows of the electric field illustrated in FIG. 19 indicate directions of the electric field. At this time, the crystal piece 10 is displaced in a form indicated as an appearance (shape) H1. When the crystal piece 10 is displaced in a form indicated as an appearance (shape) H2, an electric field of which directions are opposite to the directions of the electric field illustrated in FIG. 19 is generated. In such a manner, the alternating electric field between the first to fourth sub-electrodes 71 to 74 caused by the sub-oscillation of the crystal resonator 105 is generated. A support point (position of the conductive adhesive 49) of the crystal piece 10 is preferably set on nodal lines L1 and L2 of the contour oscillation or in the vicinity of the nodal lines L1 and L2 to minimize an effect of the support point on the contour oscillation.

Even in the Embodiment 5, advantages similar to those of the Embodiment 1 may be obtained. That is, since the output of the crystal resonator 105 in the oscillation state can be monitored via the electrode for sub-oscillation 70, the state before an output stop of the crystal resonator 105 can be similarly detected. Thus, at a time of the detection of the state before an output stop, an alarm can be initiated and a period until the gain of the inverting amplifier 206 is raised and the crystal resonator 105 comes to an output stop can be extended. In addition, according to the Embodiment 5, since the output of the crystal resonator 105 in the oscillation state can be indirectly monitored via the electrode for sub-oscillation 70, a monitoring system independent of the oscillation circuit can be formed. Therefore, according to the Embodiment 5, the output of the crystal resonator 105 in the oscillation state can be monitored in a form that does not have an effect on the oscillation circuit.

Although the functions of the alarm initiating circuit 255, the gain control circuit 260, and the reference voltage generating unit 275 are realized by the IC 200D in the Embodiment 5 described above, at least a part of the functions may be realized by a computer. For example, the functions of the alarm initiating circuit 255 and the gain control circuit 260 may be realized by a program being executed by a CPU of the computer and the function of the reference voltage generating unit 275 may be realized by a memory of the computer.

Figure 20:
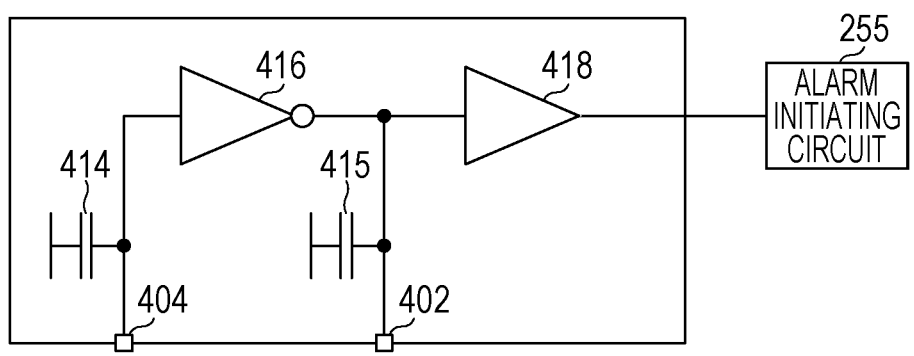
FIG. 20 is an explanatory diagram of an oscillation circuit for sub-oscillation.

In addition, in the Embodiment 5 described above, an oscillation circuit for sub-oscillation 400 may be provided between the alarm initiating circuit 255 and the electrode for sub-oscillation 70 as illustrated in FIG. 20. In an example illustrated in FIG. 20, the oscillation circuit for sub-oscillation 400 includes matching capacitors 414 and 415, an inverting amplifier 416, and an amplifier for monitoring 418. The third sub-electrode 73 and the fourth sub-electrode 74 are electrically connected to an output terminal 402 of the oscillation circuit for sub-oscillation 400. The first sub-electrode 71 and the second sub-electrode 72 are electrically connected to an input terminal 404 of the oscillation circuit for sub-oscillation 400. In this case, the alarm initiating circuit 255 can monitor the level of the sub-oscillation via the output of the amplifier for monitoring 418.

Although the electrode for sub-oscillation 70 is provided in the crystal piece 10 in the Embodiment 5 described above, the electrode for sub-oscillation 70 is not limited to be provided in the crystal piece 10. The electrode for sub-oscillation 70 may be formed on the internal surface (outer surface on the housing inner portion side) of the lower portion of the housing 30. In this case as well, the electrode for sub-oscillation 70 can pick up a signal caused by the sub-oscillation.

[Embodiment 6]

An Embodiment 6 is different from the Embodiment 1 described above in that the output of the crystal resonator in the oscillation state is optically monitored. That is, in the Embodiment 1 described above, the output of the crystal resonator in the oscillation state is monitored via the signal that appears at the point B (between the inverting amplifier 206 and the output buffer 208) within the oscillation circuit as described above. On the contrary, in the Embodiment 6, the output of the crystal resonator in the oscillation state is monitored, using a light receiving signal of which amplitude changes according to the oscillation level of the crystal resonator as will be described below.

Figure 21:
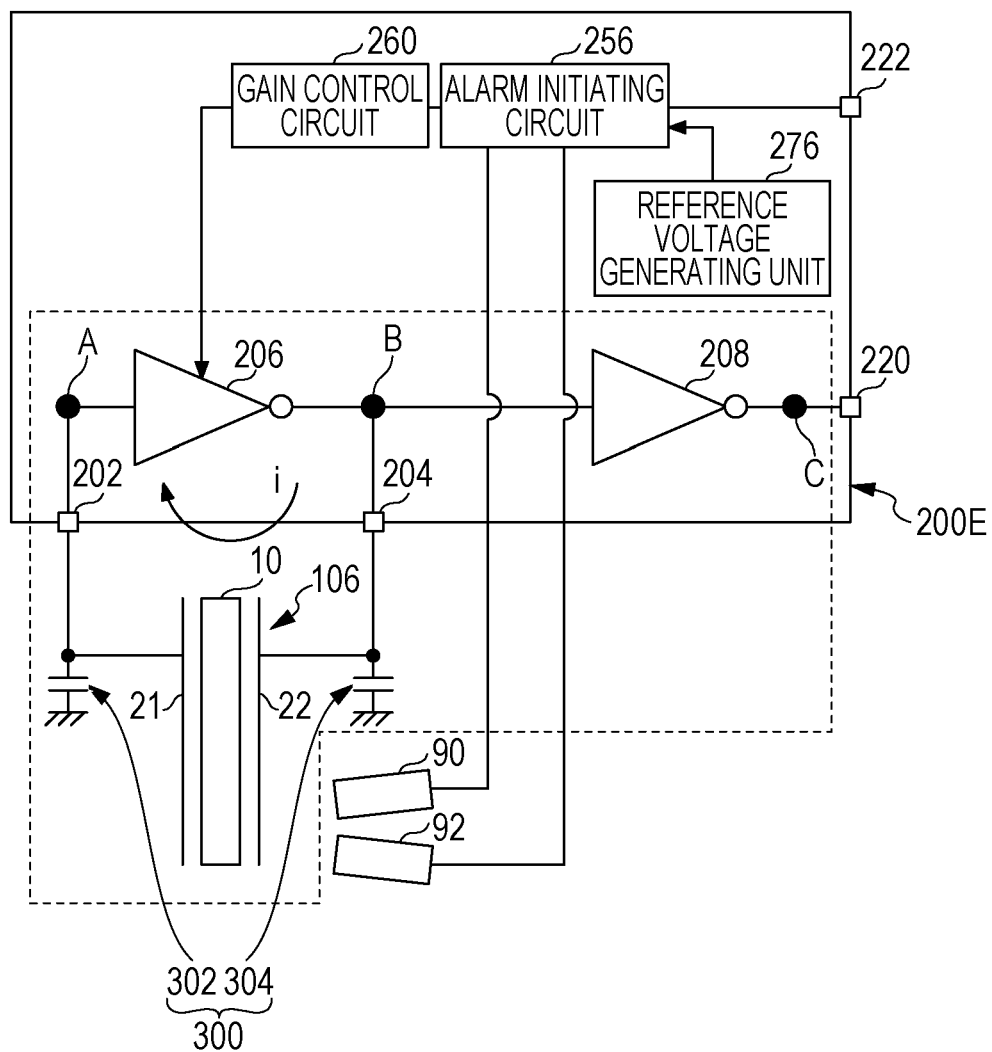
FIG. 21 is a diagram roughly illustrating an example of a circuit configuration of a crystal oscillator including a crystal resonator and an IC (Embodiment 6)

FIG. 21 is a diagram roughly illustrating an example of a circuit configuration of a crystal oscillator including a crystal resonator 106 and an IC 200E. In FIG. 21, with respect to the IC 200E, internal capacitance of a terminal, stray capacitance of a wiring pattern of a mount substrate, a resistance or the like that limits a current (refer to the arrow i of FIG. 21) that flows in the crystal resonator 106 are not illustrated. In FIG. 21, the same reference numerals will be attached to configuration elements that may be seen as the same as the configuration elements in the Embodiment 1 described above will be attached and description of the same configuration elements will not be repeated.

The crystal resonator 106 is different from the crystal resonator 100 according to the Embodiment 1 described above in that a light emitting element 90 and a light receiving element 92 are added to the crystal resonator 106. The light receiving element may include a photodetector. The photodetector may include an imaging element (for example, provided in a camera) or may include a phototransistor, a photodiode or a photomultiplier tube.

Although the light emitting element 90 may be any light source including a gas laser, a light-emitting diode (LED), a halogen lamp, the light emitting element 90 is preferably a semiconductor laser from a perspective of mountability. The light receiving element 92 may be an imaging element (for example, provided in a camera) or may be a photodiode or a photomultiplier tube. The light emitting element 90 and the light receiving element 92 are provided in the crystal resonator 106 such that light emitted from the light emitting element 90 and reflected from the excitation electrode 20 is received by the light receiving element 92. For example, the light emitting element 90 and the light receiving element 92 may be fixed to the housing 30 (refer to FIG. 22).

The IC 200E is different from the IC 200 according to the Embodiment 1 described above in that the IC 200E does not have the amplifier for monitoring 240 and is provided with each of an alarm initiating circuit 256 and a reference voltage generating unit 276 instead of the alarm initiating circuit 250 and the reference voltage generating unit 270. The IC 200E forms an example of the crystal oscillator along with the crystal resonator 106.

The light emitting element 90 and the light receiving element 92 are electrically connected to the IC 200E as illustrated in FIG. 21. The IC 200E and the light emitting element 90 and the IC 200E and the light receiving element 92 may be electrically connected to each other by using any method.

The alarm initiating circuit 256 drives the light emitting element 90 in the crystal resonator 106 in the oscillation state and has a drive function of generating light from the light emitting element 90.

In addition, the alarm initiating circuit 256 has a function (state before an output stop detecting function) of detecting a state (state before an output stop) before the crystal resonator 106 comes to an output stop. The alarm initiating circuit 256 is electrically connected to the light emitting element 90. The alarm initiating circuit 256 realizes the state before an output stop detecting function by monitoring a signal (hereinafter, also referred to as the "light receiving signal") representing the intensity (light received amount) of the reflected light received by the light receiving element 92. The alarm initiating circuit 256 initiates an alarm in a case where the amplitude (another example of the index value) of the light receiving signal is equal to or lower than a predetermined reference value $\beta6$. The reference value $\beta6$ is set to a value greater than amplitude Em of the light receiving signal when the amplitude of the input into the output buffer 208 is the input lower limit value. For example, the reference value $\beta6$ may satisfy $\beta6=1.1\times Em$ or $\beta6>1.1\times Em$. The reference value $\beta6$ may be set in a form similar to the reference value $\beta$ described above. That is, the reference value $\beta6$ may be set based on the design value of the input lower limit value of the output buffer 208 and the measured value at a time of shipment (for example, a measured value of the amplitude Em).

The reference voltage generating unit 276 generates a voltage corresponding to the reference value $\beta6$ used by the alarm initiating circuit 256.

Figure 22:
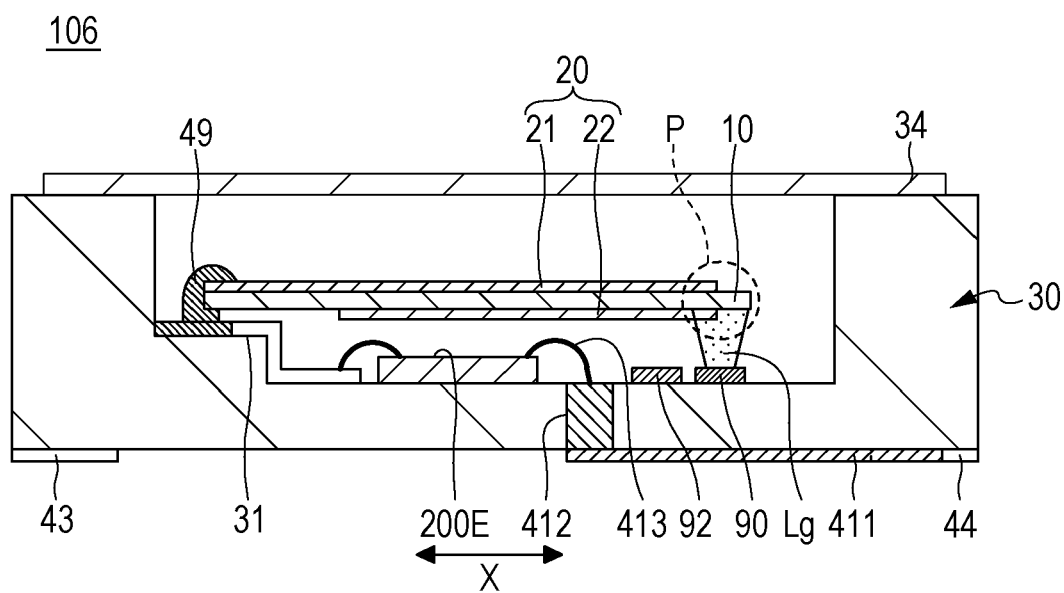
FIG. 22 is an explanatory diagram of mounting examples of a light emitting element and a light receiving element.

FIG. 22 is an explanatory diagram of mounting examples of the light emitting element 90 and the light receiving element 92 and is a rough sectional view of the crystal resonator 106. FIG. 22 corresponds to a sectional view taken along the line B-B in FIG. 1A. In FIG. 22, light Lg from the light emitting element 90 is schematically illustrated. In FIG. 22, the IC 200E is illustrated in addition to the crystal resonator 106.

In an example illustrated in FIG. 22, the light emitting element 90 is fixed to the internal surface (outer surface on the housing inner portion side) of the lower portion of the housing 30 and has an optical axis extending upward. The light emitting element 90 is provided at a position opposing the edge portion of the lower excitation electrode 22 in the up-and-down direction. The lower excitation electrode 22 is formed of a material that reflects light. The light receiving element 92 is arranged side by side with the light emitting element 90 and is fixed to the internal surface (outer surface on the housing inner portion side) of the lower portion of the housing 30. The light receiving element 92 is provided at a position where the light emitted from the light emitting element 90 and reflected from the lower excitation electrode 22 can be received. Each of the light emitting element 90 and the light receiving element 92 is electrically connected to the IC 200E as described above. The light emitting element 90 and the IC 200E and the light receiving element 92 and the IC 200E may be electrically connected to each other by using any method. The electrical connection between the light emitting element 90 and the IC 200E and the electrical connection between the light receiving element 92 and the IC 200E may be realized, for example, by wire bonding or the like.

Although the light emitting element 90 is fixed to the housing 30 in a form of shedding light on the lower outer surface of the crystal piece 10 in an example illustrated in FIG. 22, the light emitting element 90 may be fixed to the housing 30 (for example, the lid 34) in a form of shedding light on the upper outer surface (edge portion of the upper excitation electrode 21) of the crystal piece 10. In this case, the light receiving element 92 is similarly provided at the position where the light emitted from the light emitting element 90 and reflected from the upper excitation electrode 21 can be received. In addition, in a case where the housing 30 (for example, the lid 34) is formed of a material with light-transmittance, such as a transparent ceramic, the light emitting element 90 and/or the light receiving element 92 may be provided outside the housing 30. In addition, although the light emitting element 90 and the light receiving element 92 are provided in a form such that the light emitting element 90 and the light receiving element 92 are adjacent to each other in the X-direction in the example illustrated in FIG. 22, the light emitting element 90 and the light receiving element 92 may be provided in a form such that the light emitting element 90 and the light receiving element 92 are adjacent to each other in other direction.

Figure 23:
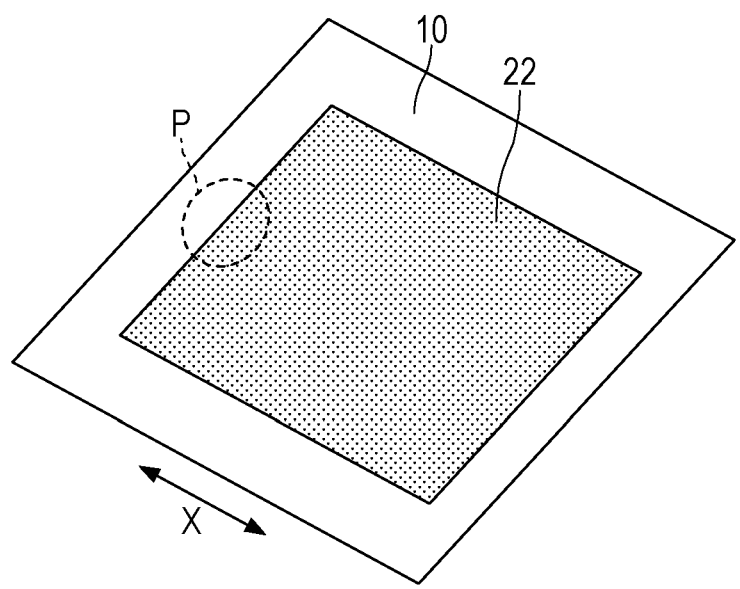
FIG. 23 is a perspective view schematically illustrating an irradiation portion of light from the light emitting element.

FIG. 23 is a perspective view schematically illustrating an irradiation portion P of the light Lg from the light emitting element 90.

In the oscillation state of the crystal resonator 106, the light emitting element 90 irradiates the lower excitation electrode 22 with the light Lg. At this time, the irradiation portion (for example, a spot of laser light) P includes the edge portion of the lower excitation electrode 22 and a part of the crystal piece 10 adjacent to the edge portion in the X-direction as illustrated in FIG. 23. That is, the light emitting element 90 simultaneously irradiates the edge portion of the lower excitation electrode 22 and the part of the crystal piece 10 adjacent to the edge portion in the X-direction with light.

In such a manner, once the lower excitation electrode 22 is irradiated with the light Lg, the light that is shed on the lower excitation electrode 22 is reflected and the reflected light is generated. On the other hand, the crystal piece 10 transmits light and does not practically reflect light. Therefore, the reflected light is practically generated only from the lower excitation electrode 22. The reflected light is incident to the light receiving element 92 disposed below the lower excitation electrode 22. That is, the light receiving element 92 receives the reflected light from the lower excitation electrode 22.

Figure 24A:
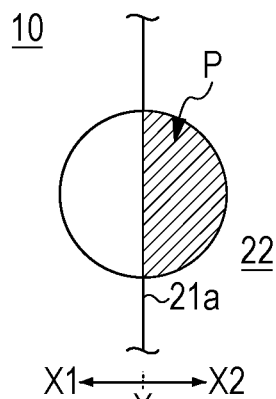
FIG. 24A is an explanatory diagram of a characteristic detection principle of the crystal resonator.
Figure 24B:
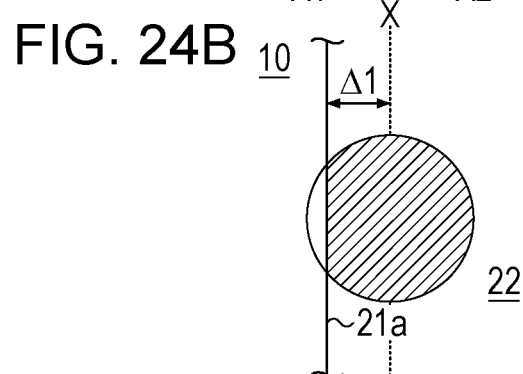
FIG. 24B is the explanatory diagram of the characteristic detection principle of the crystal resonator.
Figure 24C:
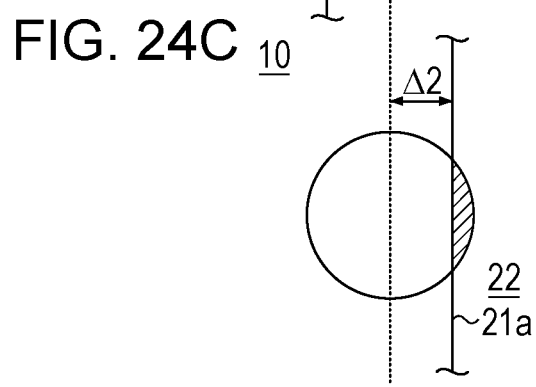
FIG. 24C is the explanatory diagram of the characteristic detection principle of the crystal resonator.

FIGS. 24A to 24C are explanatory diagrams of a characteristic detection principle of the crystal resonator 106 and FIGS. 24A to 24C are diagrams illustrating each relationship between a boundary line 21a of the edge portion of the lower excitation electrode 22 and the irradiation portion P. In FIGS. 24A to 24C, a portion related to the lower excitation electrode 22 of the irradiation portion P is hatched with a "satin finished surface".

Figure 25:
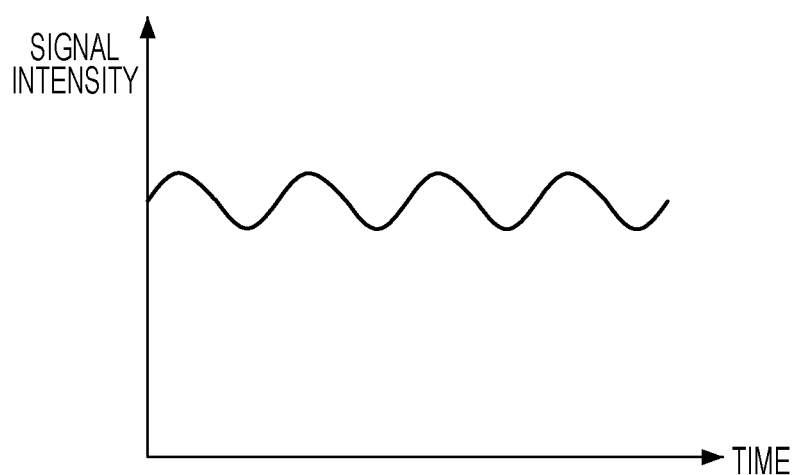
FIG. 25 is an explanatory diagram of changes in intensity of a light receiving signal.

In the oscillation state of the crystal resonator 106, the area of the portion related to the lower excitation electrode 22 of the irradiation portion P changes along with the main oscillation of the crystal piece 10 as illustrated in FIGS. 24A to 24C. For example, once the crystal piece 10 is displaced due to the main oscillation of the crystal piece 10 by Δ1 on an X1 side of the X-direction as illustrated in FIG. 24B compared to a state illustrated in FIG. 24A, the area of the portion related to the lower excitation electrode 22 of the irradiation portion P increases compared to the state illustrated in FIG. 24A. At this time, the amount of the reflected light received by the light receiving element 92 increases compared to the state illustrated in FIG. 24A. On the other hand, once the crystal piece 10 is displaced due to the main oscillation of the crystal piece 10 by Δ2 on an X2 side of the X-direction as illustrated in FIG. 24C compared to the state illustrated in FIG. 24A, the area of the portion related to the lower excitation electrode 22 of the irradiation portion P decreases compared to the state illustrated in FIG. 24A. At this time, the amount of the reflected light received by the light receiving element 92 decreases compared to the state illustrated in FIG. 24A. In such a manner, the amount of the reflected light received by the light receiving element 92 changes along with the oscillation of the crystal piece 10. That is, as illustrated in FIG. 25, the amount (intensity of the light receiving signal) of the reflected light received by the light receiving element 92 changes according to the output characteristic of the crystal piece 10. In FIG. 25, signal intensity is plotted on the vertical axis, time is plotted on the horizontal axis, and changes in the intensity of the light receiving signal are illustrated. The intensity of the light receiving signal oscillates at a frequency corresponding to the output frequency of the crystal resonator 106 as illustrated in FIG. 25.

Once the oscillation level of the crystal piece 10 declines, the amount of fluctuation in the area of the portion related to the lower excitation electrode 22 of the irradiation portion P declines due to the oscillation of the crystal piece 10. Therefore, the amount of fluctuation in the amount of the reflected light received by the light receiving element 92 declines. That is, the amplitude of the light receiving signal declines along with a decline in the oscillation level of the crystal resonator 106. Therefore, the oscillation level of the crystal piece 10 can be indirectly monitored by monitoring the amplitude of the light receiving signal obtained by the light receiving element 92.

Even in the Embodiment 6, advantages similar to those of the Embodiment 1 may be obtained. That is, the state before an output stop of the crystal resonator 106 can be similarly detected since the output of the crystal resonator 106 in the oscillation state can be monitored via the light emitting element 90 and the light receiving element 92. Thus, at a time of the detection of the state before an output stop, an alarm can be initiated and a period until the gain of the inverting amplifier 206 is raised and the crystal resonator 106 comes to an output stop can be extended. In addition, according to the Embodiment 6, since the output of the crystal resonator 106 in the oscillation state can be optically monitored via the light emitting element 90 and the light receiving element 92, a monitoring system independent of the oscillation circuit can be formed. Therefore, according to the Embodiment 6, the output of the crystal resonator 106 in the oscillation state can be monitored in a form that does not have an effect on the oscillation circuit.

Although the functions of the alarm initiating circuit 256, the gain control circuit 260, and the reference voltage generating unit 276 are realized by the IC 200E in the Embodiment 6 described above, at least a part of the functions may be realized by a computer. For example, the functions of the alarm initiating circuit 256 and the gain control circuit 260 may be realized by a program being executed by a CPU of the computer and the function of the reference voltage generating unit 276 may be realized by a memory of the computer.

In addition, although the optical signal of which the amplitude changes according to the oscillation level of the crystal resonator 106 is obtained by simultaneously shedding light on the edge portion of the excitation electrode 20 and the crystal piece 10 in the Embodiment 6 described above, obtaining the light receiving is not limited to the method of simultaneously shedding light on the edge portion of the excitation electrode 20 and the crystal piece 10. For example, obtaining the identical light receiving signal is also possible by forming a slit in the excitation electrode 20 and simultaneously shedding light on the slit in the excitation electrode 20 and the surroundings of the excitation electrode 20.

[Embodiment 7]

An Embodiment 7 is different from the Embodiment 1 in that the crystal resonator 100 and the IC 200 are respectively replaced with a crystal resonator 107 and an IC 200F. The Embodiment 7 is different from the Embodiment 1 described above in that the excitation electrode 20 is replaced with an excitation electrode 20F. In addition, the crystal resonator 107 according to the Embodiment 7 is different from the crystal resonator 100 according to the Embodiment 1 described above in that the coil 50 and the magnet 59 are replaced with a coil 50F. In addition, the crystal resonator 107 according to the Embodiment 7 is different from the crystal resonator 100 according to the Embodiment 1 described above in that a coil substrate 510F is added to the crystal resonator 107. Other configuration elements in the crystal resonator 107 may be the same as the configuration elements of the crystal resonator 100 according to the Embodiment 1 described above and description of the other configuration elements will not be repeated.

Figure 26:
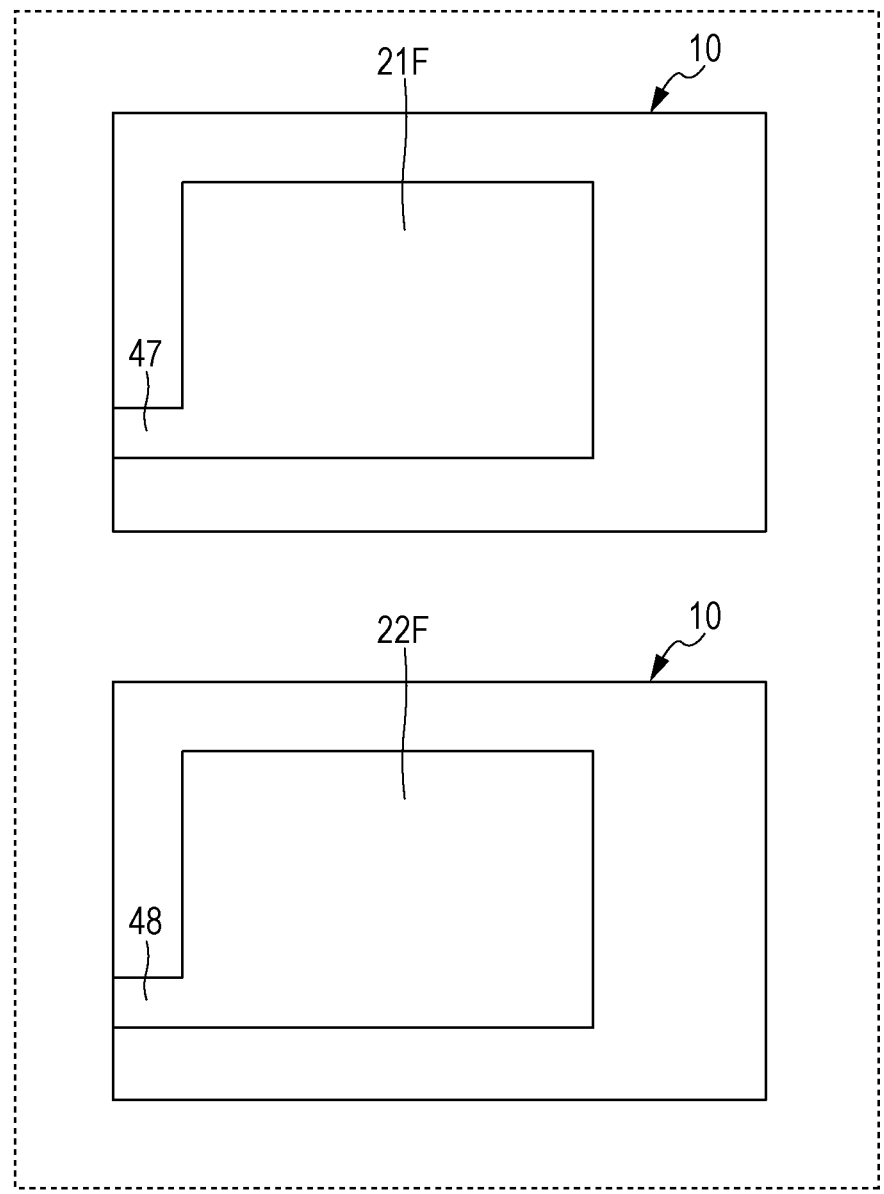
FIG. 26 is an explanatory diagram of an excitation electrode according to an Embodiment 7.

FIG. 26 is an explanatory diagram of the excitation electrode 20F according to the Embodiment 7 and is a two-side diagram (plan view illustrating an upper outer surface and a lower outer surface) of the crystal piece 10.

The excitation electrode 20F is different from the excitation electrode 20 according to the Embodiment 1 described above in that the upper excitation electrode 21 and the lower excitation electrode 22 are respectively replaced with an upper excitation electrode 21F (an example of a magnetic portion) and a lower excitation electrode 22F.

The upper excitation electrode 21F is formed of a magnetic material having conductivity. The upper excitation electrode 21F may be formed using, for example, iron, nickel, cobalt, or the like. The upper excitation electrode 21F may be formed (that is, film forming) in the form of a film. The lower excitation electrode 22F is formed of a non-magnetic material. For example, the lower excitation electrode 22F may be formed of gold, silver, aluminum, or the like. Other configurations of the excitation electrode 20F may be the same as the configurations of the excitation electrode 20 according to the Embodiment 1 described above and will not be described further.

Figure 27:
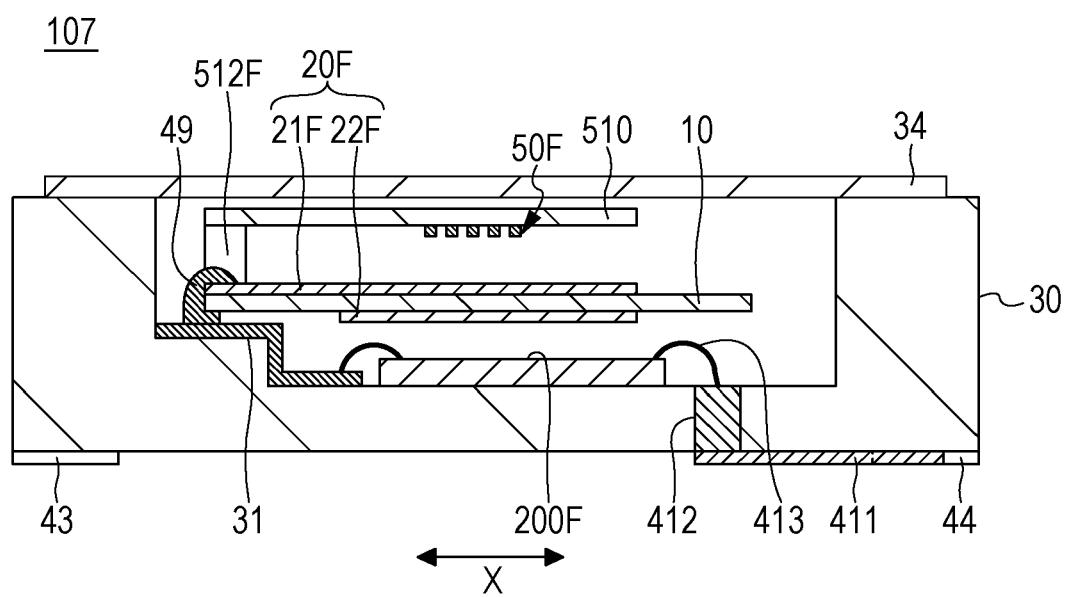
FIG. 27 is a sectional view roughly illustrating a mounting example of a coil.
Figure 28:
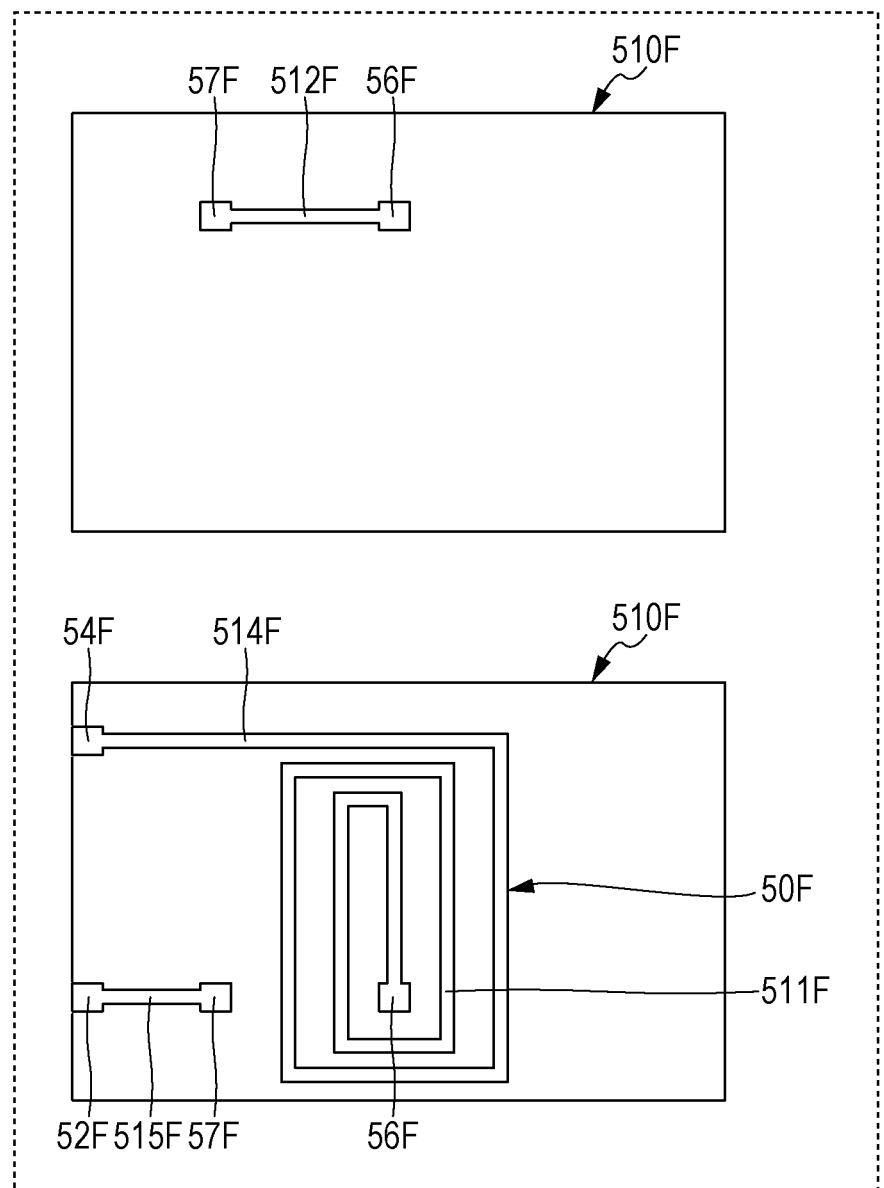
FIG. 28 is a two-side diagram of a coil substrate.

FIG. 27 is a sectional view roughly illustrating a mounting example of the coil 50F and FIG. 28 is a two-side diagram (plan view illustrating an upper outer surface and a lower outer surface) of the coil substrate 510F.

As will be described later, the coil 50F forms an electromagnet and generates a magnetic field. The coil 50F may be disposed at any position with respect to the upper excitation electrode 21F insofar the coil 50F is in a form that generates a magnetic field which extends to the upper excitation electrode 21F. For example, as illustrated in FIG. 27 and FIG. 28, the coil 50F may be formed on the coil substrate 510F which is provided so as to be parallel to the upper excitation electrode 21F. In addition, the coil 50F may be formed on the lid 34 of the housing 30. In addition, the coil 50F may be disposed on the upper outer surface of the IC 200F or may be formed on the internal surface of the lower portion of the housing 30.

In examples of FIG. 27 and FIG. 28, the coil 50F includes a coil pattern section 511F, wiring sections 512F, 514F, and 515F, and through holes 56F and 57F. The coil pattern section 511F is formed in a spiral on the lower outer surface of the coil substrate 510F. The coil pattern section 511F is formed at a position opposing the magnet 59F in the up-and-down direction. One end of the coil pattern section 511F is electrically connected to an electrode 54F formed on the lower outer surface of the coil substrate 510F via the wiring section 514F formed on the lower outer surface of the coil substrate 510F. The other end (end portion on the center side of winding in plan view) of the coil pattern section 511F is pulled out to the upper outer surface of the coil substrate 510F via the through hole 56F. The wiring section 512F is formed on the upper outer surface of the coil substrate 510F. The through holes 56F and 57F are electrically connected to both ends of the wiring section 512F. The wiring section 515F is formed on the lower outer surface of the coil substrate 510F. The wiring section 515F electrically connects the through hole 57F to an electrode 52F formed on the lower outer surface of the coil substrate 510F. In such a manner, the other end of the coil pattern section 511F is electrically connected to the electrode 52F via the through hole 56F, the wiring section 512F, the through hole 57F, and the wiring section 515F. Each of the electrodes 52F and 54F is electrically connected to the IC 200F via the conductive adhesive 49 (refer to FIG. 27).

Although the coil pattern section 511F of the coil 50F is formed on the lower outer surface of the coil substrate 510F in the examples illustrated in FIG. 27 and FIG. 28, the coil pattern section 511F may be formed on the upper outer surface of the coil substrate 510F.

Figure 29:
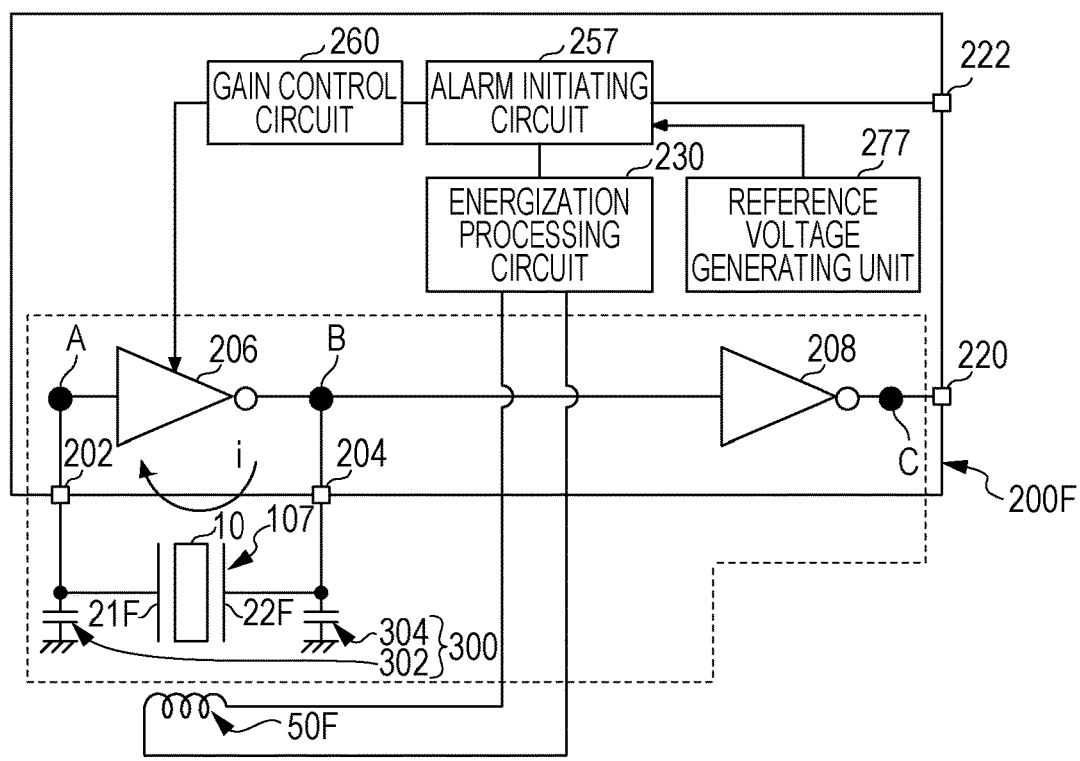
FIG. 29 is a diagram roughly illustrating an example of a circuit configuration of a crystal oscillator including a crystal resonator and an IC (Embodiment 7)
Figure 30:
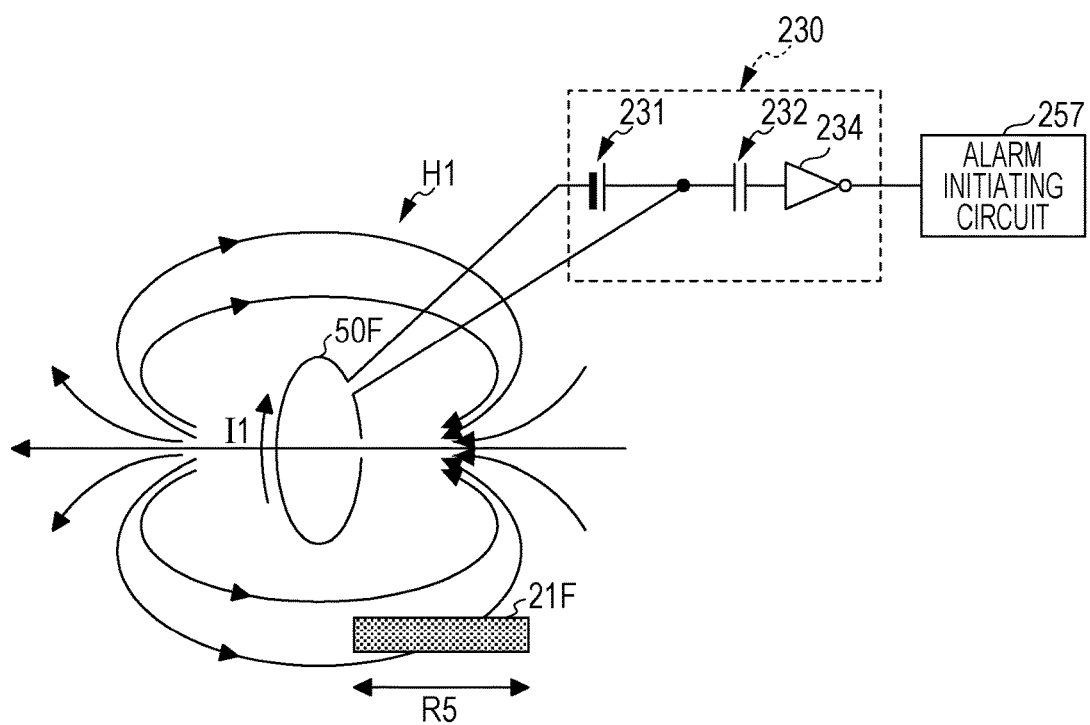
FIG. 30 is an explanatory diagram of an electromagnet circuit and a principle of generating an alternating current waveform.

FIG. 29 is a diagram roughly illustrating an example of a circuit configuration of a crystal oscillator including the crystal resonator 107 and the IC 200F. FIG. 30 is an explanatory diagram of an energization processing circuit 230 and a principle of generating an alternating current waveform. In FIG. 29, with respect to the IC 200F, internal capacitance of a terminal, stray capacitance of a wiring pattern of a mount substrate, a resistance or the like that limits a current (refer to the arrow i of FIG. 29) that flows in the crystal resonator 107 are not illustrated. In FIG. 29, the same reference numerals will be attached to configuration elements that may be seen as the same as the configuration elements in the Embodiment 1 described above will be attached and description of the same configuration elements will not be repeated.

The IC 200F is different from the IC 200 according to the Embodiment 1 described above in that each of an alarm initiating circuit 257 and a reference voltage generating unit 277 is provided instead of the alarm initiating circuit 250 and the reference voltage generating unit 270. In addition, the IC 200F is different from the IC 200 according to the Embodiment 1 described above in that the energization processing circuit 230 is added to the IC 200F. The IC 200F forms an example of the crystal oscillator along with the crystal resonator 107.

The coil 50F is electrically connected to the energization processing circuit 230. The energization processing circuit 230 includes a direct current power supply 231, a capacitor 232, and an amplifier 234.

Once the crystal piece 10 oscillates at a certain frequency, the upper excitation electrode 21F oscillates (thickness shear oscillation) at this frequency, at a time of oscillation of the crystal resonator 107. At this time, as illustrated in FIG. 30, in the coil 50F disposed above the upper excitation electrode 21F, an alternating current waveform at a frequency corresponding to the output frequency of the crystal piece 10 caused by the oscillation of the upper excitation electrode 21F is generated. Specifically, the coil 50F is a coil of the electromagnet and forms a magnetic field H1 that extends to the upper excitation electrode 21F as schematically illustrated in FIG. 30 at a time of energization by the direct current power supply 231. At this time, as schematically illustrated in FIG. 30, once the upper excitation electrode 21F oscillates (refer to an arrow R5), the magnetic field H1 receives an effect of the oscillation of the upper excitation electrode 21F serving as a magnetic substance. That is, changes in the magnetic flux occur in accordance with the oscillation of the upper excitation electrode 21F serving as a magnetic substance, and electromotive force is generated in the coil 50F (coil pattern section 511F) in a direction of hindering the changes. As a result, the alternating current waveform of the frequency corresponding to the output frequency of the crystal piece 10 is superimposed on a current I1 that flows in the coil 50F.

Therefore, as schematically illustrated in FIG. 30, such an alternating current waveform can be generated in the coil 50F by providing the coil 50F outside the crystal resonator 107. In an example illustrated in FIG. 30, a direct current component of a reception signal including the alternating current waveform generated in the coil 50F is cut by the capacitor 232 and an alternating current component of the reception signal is amplified by the amplifier 234. The amplified alternating current component is applied to the alarm initiating circuit 257. In such a manner, the frequency and the amplitude of the voltage waveform generated between the both ends of the coil 50F decline along with a decline in the oscillation level of the crystal resonator 107. With respect to the amplitude, the amount of change in the magnetic flux in the coil 50F becomes smaller along with the decline in the oscillation level of the crystal resonator 107.

The alarm initiating circuit 257 has a function (state before an output stop detecting function) of detecting a state (state before an output stop) before the crystal resonator 107 comes to an output stop. The alarm initiating circuit 257 is electrically connected to the coil 50F. The alarm initiating circuit 257 realizes the state before an output stop detecting function by monitoring a signal that appears in the coil 50F. The alarm initiating circuit 257 initiates an alarm in a case where the amplitude (amplitude of a voltage waveform that is generated between both ends of the coil 50F) of the signal that appears in the coil 50F is equal to or lower than a predetermined reference value $\beta 7$. The reference value $\beta 7$ is set to a value greater than amplitude Fm of the signal that appears in the coil 50F when the amplitude of the input into the output buffer 208 is the input lower limit value. For example, the reference value $\beta 7$ may satisfy $\beta 7 = 1.1 \times Fm$ or $\beta 7 > 1.1 \times Fm$. The reference value $\beta 7$ may be set in a form similar to the reference value $\beta$ described above. That is, the reference value $\beta 7$ may be set based on the design value of the input lower limit value of the output buffer 208 and the measured value at a time of shipment (for example, a measured value of the amplitude Fm).

The reference voltage generating unit 277 generates a voltage corresponding to the reference value $\beta 7$ used by the alarm initiating circuit 257.

Even in the Embodiment 7, the same advantages as in the Embodiment 1 may be obtained. That is, since the output of the crystal resonator 107 in the oscillation state can be monitored via the signal that appears in the coil 50F, the state before an output stop of the crystal resonator 107 can be similarly detected. Thus, at a time of the detection of the state before an output stop, an alarm can be initiated and a period until the gain of the inverting amplifier 206 is raised and the crystal resonator 107 comes to an output stop can be extended. In addition, according to the Embodiment 7, since the output of the crystal resonator 107 in the oscillation state can be electromagnetically monitored via the signal that appears in the coil 50F, a monitoring system independent of the oscillation circuit can be formed. Therefore, according to the Embodiment 7, the output of the crystal resonator 107 in the oscillation state can be monitored in a form that does not have an effect on the oscillation circuit.

Although the coil 50F is provided at a place other than the crystal piece 10 in the crystal resonator 107 in the Embodiment 7, the coil 50F may be provided outside the housing 30 of the crystal resonator 107, for example, along with the IC 200F.

Hereinbefore, although each example has been described in detail, the disclosure is not limited to a specific example and various modifications and alterations can be made without departing from the scope of the disclosure. In addition, all or a plurality of configuration elements of the aforementioned examples can be incorporated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A crystal oscillator comprising:
   a crystal resonator;
   an inverting amplifier configured to be coupled between a pair of excitation electrodes of the crystal resonator; and
   a control circuit configured to initiate an alarm and to raise a gain of the inverting amplifier in a case where an index value which represents an oscillation amplitude of the crystal resonator in an oscillation state, is equal to or lower than a reference value, the gain of the inverting amplifier being raised to delay an output stop of the crystal resonator, the alarm being provided as an output of the crystal oscillator.

2. The crystal oscillator according to claim 1,
   wherein the reference value is greater than the index value when the crystal resonator comes to an output stop.

3. The crystal oscillator according to claim 1, further comprising:
   an output buffer configured to be provided on an output side of the inverting amplifier.

4. The crystal oscillator according to claim 3,
   wherein the index value is generated based on a signal that appears between the inverting amplifier and the output buffer.

5. The crystal oscillator according to claim 4, further comprising:
   an amplifier configured to amplify the signal,
   wherein the index value includes an amplitude of an output of the amplifier.

6. The crystal oscillator according to claim 3,
   wherein the output buffer has an input lower limit value with respect to an input, and
   the reference value is greater than the input lower limit value.

7. The crystal oscillator according to claim 5,
   wherein the output buffer has an input lower limit value with respect to an input, and
   the reference value is greater than a value obtained by multiplying the input lower limit value by an amplification factor of the amplifier.

8. The crystal oscillator according to claim 1,
   wherein the inverting amplifier includes an operational amplifier, a first resistance, and a second resistance of which a resistance value is greater than a resistance value of the first resistance, and
   the control circuit configured to raise the gain by switching from a first state in which an inverting terminal of the operational amplifier is coupled to an output terminal of the operational amplifier via the first resistance to a second state in which the inverting terminal is coupled to the output terminal via the second resistance.

9. The crystal oscillator according to claim 1,
   wherein the inverting amplifier and the control circuit are realized by an IC and the IC is provided within a housing of the crystal resonator.

10. The crystal oscillator according to claim 1,
    wherein the crystal resonator includes a coil and a magnetic flux generation member that is configured to generate magnetic flux that passes through the coil, and
    the index value is generated based on a signal that appears in the coil.

11. The crystal oscillator according to claim 1,
    wherein the crystal resonator includes a transmission antenna configured to be coupled to one of the pair of excitation electrodes and a reception antenna, and
    the index value is generated based on a signal that appears in the reception antenna.

12. The crystal oscillator according to claim 1,
    wherein the crystal resonator includes a pair of electrodes for sub-oscillation in which changes in an electric field related to sub-oscillation occurs, and
    the index value is generated based on a signal that appears in the pair of electrodes for sub-oscillation.

13. The crystal oscillator according to claim 1,
    wherein the crystal resonator includes a light-emitting diode, a lamp, or a semiconductor laser configured to shed light on one of the pair of excitation electrodes to generate reflected light reflected by the one excitation electrode and a photodetector configured to receive the reflected light, and
    the index value is generated based on a signal that appears in the photodetector.

14. The crystal oscillator according to claim 1,
    wherein the crystal resonator includes a magnetic body and an electromagnet that is configured to generate a magnetic field that extends to the magnetic body, and
    the index value is generated based on a signal that appears in a coil of the electromagnet.

15. A crystal oscillator controlling method comprising:
    initiating an alarm and raising a gain of an inverting amplifier coupled between a pair of excitation electrodes of a crystal resonator in a case where an index value representing an oscillation amplitude of the crystal resonator in an oscillation state is equal to or lower than a reference value, the gain of the inverting amplifier being raised to delay an output stop of the crystal resonator, the alarm being provided to an output of the crystal oscillator.

16. A crystal resonator controlling device comprising:
    an inverting amplifier configured to be coupled between a pair of excitation electrodes of a crystal resonator; and
    a control circuit configured to initiate an alarm and to raise a gain of the inverting amplifier in a case where an index value representing oscillation amplitude of the crystal resonator in an oscillation state is equal to or lower than a reference value, the gain of the inverting amplifier being raised to delay an output stop of the crystal resonator, the alarm being provided as an output of the control circuit.

* * * * *